US007837890B2

(12) United States Patent
Stockum et al.

(10) Patent No.: US 7,837,890 B2
(45) Date of Patent: Nov. 23, 2010

(54) PRINTABLE MEDIUM FOR THE ETCHING OF SILICON DIOXIDE AND SILICON NITRIDE LAYERS

(75) Inventors: Werner Stockum, Reinheim (DE); Armin Kuebelbeck, Bensheim (DE); Sylke Klein, Rossdorf (DE)

(73) Assignee: Merck Patent GmbH, Darmstadt (DE)

( * ) Notice: Subject to any disclaimer, the term of this patent is extended or adjusted under 35 U.S.C. 154(b) by 659 days.

(21) Appl. No.: 11/813,632

(22) PCT Filed: Dec. 19, 2005

(86) PCT No.: PCT/EP2005/013657

§ 371 (c)(1),
(2), (4) Date: Jul. 10, 2007

(87) PCT Pub. No.: WO2006/074791

PCT Pub. Date: Jul. 20, 2006

(65) Prior Publication Data

US 2008/0121621 A1    May 29, 2008

(30) Foreign Application Priority Data

Jan. 11, 2005  (DE) .................. 10 2005 001 343
Feb. 18, 2005  (DE) .................. 10 2005 007 743

(51) Int. Cl.
*C03C 15/00*   (2006.01)
*C03C 25/68*   (2006.01)

(52) U.S. Cl. ................ 216/89; 216/83; 216/99; 252/79.1

(58) Field of Classification Search ............... 216/83, 216/89, 99; 252/79.1
See application file for complete search history.

(56) References Cited

U.S. PATENT DOCUMENTS

| 4,348,255 | A | 9/1982 | Schmidt et al. |
| 4,921,626 | A | 5/1990 | Rhodenbauch et al. |
| 5,688,366 | A | 11/1997 | Ichinose et al. |
| 6,670,281 | B2 * | 12/2003 | Luly et al. ............ 438/755 |
| 2003/0160026 | A1 | 8/2003 | Klein et al. |
| 2004/0242019 | A1 | 12/2004 | Klein et al. |

FOREIGN PATENT DOCUMENTS

| CN | 1 277 944 A | 12/2000 |
| GB | 1 145 404 A | 3/1969 |
| GB | 1572032 A * | 7/1980 |
| WO | WO 01/83391 A1 | 11/2001 |
| WO | WO 03/034504 A1 | 4/2003 |

* cited by examiner

*Primary Examiner*—Roberts Culbert
(74) *Attorney, Agent, or Firm*—Millen, White, Zelano & Branigan, P.C.

(57) ABSTRACT

The present invention relates to a novel printable etching medium having non-Newtonian flow behavior for the etching of surfaces in the production of solar cells and to the use thereof. In particular, the invention relates to corresponding particle-containing compositions by means of which extremely fine structures can be etched very selectively without damaging or attacking adjacent areas.

38 Claims, No Drawings

PRINTABLE MEDIUM FOR THE ETCHING OF SILICON DIOXIDE AND SILICON NITRIDE LAYERS The present invention relates to a novel printable etching medium having non-Newtonian flow behaviour for the etching of surfaces in the production of solar cells, and to the use thereof.

The present invention furthermore also relates to etching and doping media which are suitable both for the etching of inorganic layers and for the doping of underlying layers.

In particular, these are corresponding particle-containing compositions by means of which extremely fine structures can be etched very selectively without damaging or attacking adjacent areas.

The problem of structuring oxide layers on a support material arises, for example, in the production of solar cells. A crystalline silica solar cell usually consists of a p-conducting substrate into which a layer of an n-conducting substance, for example phosphorus, of uniform thickness is diffused on the front side. A metallically conducting contact is applied to the front and reverse sides of the wafer for conduction of the current produced on incidence of light. With regard to an inexpensive production process which is suitable for mass production, the contact is usually produced by screen printing.

Besides the oxide layers that have to be structured during solar cell production, silicon nitride layers also have to be etched. For the etching of corresponding nitride layers, the methods used have to be modified and the etching pastes adapted in a suitable manner.

1. PRIOR ART AND OBJECT OF THE INVENTION

The surfaces of crystalline silicon solar cells are coated with thin inorganic layers during the production process, and optionally also after the end thereof. These layers have thicknesses in the range from 20 to 200 nm, in most cases in the range from 50 to 150 nm.

During the process for the production of crystalline silica solar cells, it is therefore advantageous in a number of process steps to etch fine lines into these inorganic layers of the solar cell.

These openings in the surface of the solar cell can be used, for example, for the production of a so-called selective emitter, also known as 2-stage emitter. To this end, a high degree of n-doping, preferably by means of phosphorus diffusing in, is produced in a subsequent diffusion step in the partial openings of a diffusion barrier located on the silicon.

In the present description, inorganic surfaces is taken to mean oxidic and nitride-containing compounds of silicon, in particular silicon oxide and silicon nitride surfaces. The mode of action of such diffusion barriers is known to the person skilled in the art and is described in the literature [A. Goetzberger; B. Voß; J. Knobloch, Sonnenenergie: Photovoltaik [Solar Energy: Photovoltaics], Teubner Studienbücher Stuttgart 1997, pp 40; 107]. These diffusion barriers can be produced in a variety of ways:

Very dense silicon dioxide layers are obtained, for example, by heat treatment of silicon in an oxygen-containing atmosphere at temperatures in the region of 900° C. (thermal oxide).

Also known to the person skilled in the art is the deposition of silicon dioxide by the CVD process. Depending on the way the reaction is carried out, a distinction is made here between, inter alia, the following processes:

APCVD (atmospheric pressure CVD)
PE-CVD (plasma enhanced CVD)
LP-CVD (low pressure CVD)

A common feature of these processes is that the desired inorganic compound is obtained from the gas phase of a volatile precursor, for example silane (SiH4) or TEOS (tetraethyl orthosilicate) in the case of silicon dioxide, by deposition of the precursor on the target substrate with decomposition.

Silicon dioxide layers which form a diffusion barrier can also be obtained by means of wet-chemical coating with a liquid or dissolved solid precursor in a solvent or solvent mixture. These liquid systems are usually applied to the substrate to be coated by spin coating. These systems are known to the person skilled in the art as spin-on-glass (SOG).

In many cases, the $SiO_2$ layer applied also remains as reflection-reducing passivation layer. This is particularly frequently the case for thermally grown $SiO_2$.

Silicon nitride layers are used less as diffusion barriers in the art of crystalline solar cells, although they are in principle likewise suitable for this purpose. Silicon nitride layers are mainly used as passivation and anti-reflection layers.

It is also advantageous in the production of crystalline silicon solar cells to be able to produce openings in a targeted manner in the silicon nitride layers. An example which may be mentioned here is the application of electrically conductive pastes. These metal pastes are usually "fired through" the silicon nitride layer at temperatures in the region of 600° C., facilitating an electrical contact to the emitter layer. Due to the high temperatures, polymer-based (epoxy or phenolic resin) metallisation pastes cannot be used. Crystal defects and metallic contamination in the underlying silicon also arise in the "fire-through process". Due to the system, the passivation layer is additionally completely destroyed by the overlying printed-on metal paste. A partial, narrower opening of the silicon nitride layer for electrical contacting would be more advantageous, with retention of the passivation layer in the edge regions, which are covered by the overlying metallisation layer.

Besides the pure diffusion barriers consisting of silicon dioxide or silicon nitride, it is also possible to use thin glass layers in the production of crystalline silicon solar cells.

Definition of Glass

Glass is taken to mean per se a homogeneous material, for example quartz, window glass, borosilicate glass, and also thin layers of these materials produced on other substrates (for example ceramics, metal sheets, silicon wafers) by various processes known to the person skilled in the art (CVD, PVD, spin-on, thermal oxidation, inter alia).

Glasses below is taken to mean silicon oxide- and silicon nitride-containing materials which are in the solid amorphous physical state without crystallisation of the glass components and which have a high degree of structural disorder in the microstructure owing to the lack of long-range order.

Besides pure $SiO_2$ glass (quartz), all glasses (for example doped glasses, such as borosilicate, phosphosilicate, borophosphosilicate glasses, coloured, milk and crystal glasses, optical glasses) which contain $SiO_2$ and other components, in particular elements such as, for example, calcium, sodium, aluminium, lead, lithium, magnesium, barium, potassium, boron, beryllium, phosphorus, gallium, arsenic, antimony, lanthanum, zinc, thorium, copper, chromium, manganese, iron, cobalt, nickel, molybdenum, vanadium, titanium, gold, platinum, palladium, silver, cerium, caesium, niobium, tantalum, zirconium, neodymium, praseodymium, which occur in the glasses in the form of oxides, carbonates, nitrates, phosphates, sulfates and/or halides or function as doping elements in the glasses, are covered. Doped glasses are, for example, borosilicate, phosphosilicate, borophosphosilicate, coloured, milk, crystal glasses and optical glasses.

The silicon nitride may likewise comprise other elements, such as boron, aluminium, gallium, indium, phosphorus, arsenic or antimony.

Definition of Silicon Oxide- and Silicon Nitride-Based Systems

Silicon oxide-based systems are defined below as all crystalline systems which do not fall under the definition of amorphous $SiO_2$ glasses given above and are based on silicon dioxide; these can be, in particular, the salts and esters of orthosilicic acid and condensation products thereof—generally known as silicates by the person skilled in the art—as well as quartz and glass-ceramics.

Furthermore, other silicon oxide- and silicon nitride-based systems, in particular the salts and esters of orthosilicic acid and condensation products thereof, are encompassed. Besides pure $SiO_2$ (quartz, tridymite, cristobalite), all $SiO_2$-based systems built up from $SiO_2$ or "discrete" and/or linked $[SiO_4]$ tetrahedra, such as, for example, mesosilicates, sorosilicates, cyclosilicates, inosilicates, phyllosilicates, tectosilicates, and other components, in particular elements/components such as, for example, calcium, sodium, aluminium, lithium, magnesium, barium, potassium, beryllium, scandium, manganese, iron, titanium, zirconium, zinc, cerium, yttrium, oxygen, hydroxyl groups, halides, are also encompassed.

Silicon nitride-based systems are defined below as all crystalline and partially crystalline (usually referred to as microcrystalline) systems which do not fall under the definition given above for the amorphous silicon nitride glasses/layers. These include $Si_3N_4$ in its $\alpha$-$Si_3N_4$ and $\beta$-$Si_3N_4$ modifications and all crystalline and partially crystalline $SiN_x$ and $SiN_x$:H layers. Crystalline silicon nitride may comprise other elements, such as boron, aluminium, gallium, indium, phosphorus, arsenic and antimony.

Etching of Structures

The use of etchants, i.e. chemically aggressive compounds, results in the dissolution of the material exposed to the etchant attack. In most cases, the aim is completely to remove the layer to be etched. The end of the etching is reached by the encountering of a layer which is substantially resistant to the etchant. In addition, there is the process known to the person skilled in the art of partial removal of a layer by etching to a target thickness which is usually defined.

Etching of Structures on Silicon Oxide- and Silicon Nitride-Based Glasses and Other Silicon Oxide- and Silicon Nitride-Based Systems:

According to the current state of the art, any desired structures can be etched selectively in silicon oxide- and silicon nitride-based glasses and other silicon oxide- and silicon nitride-based systems or surfaces thereof and layers thereof of variable thickness directly by laser-supported etching methods or, after masking, by wet-chemical methods ([1] D. J. Monk, D. S. Soane, R. T. Howe, Thin Solid Films 232 (1993), 1; [2] J. Bühler, F.-P. P. Steiner, H. Baltes, J. Micromech. Microeng. 7 (1997), R1) or by dry-etching methods ([3] M. Köhler "Ätzverfahren für die Mikrotechnik" [Etching Methods for Microtechnology], Wiley VCH 1983).

In the laser-supported etching methods, the laser beam scans the entire etching pattern on the glass dot by dot or line by line in the case of vector-orienting systems, which, besides a high degree of precision, also requires considerable adjustment effort and time.

The wet-chemical and dry-etching methods include material-intensive, time-consuming and expensive process steps.

A. Masking of the Areas not to be Etched, for Example by:
Photolithography: Production of a negative or positive of the etching structure (depending on the resist), coating of the substrate surface (for example by spin-coating with a liquid photoresist), drying of the photoresist, exposure of the coated substrate surface, development, rinsing, optionally drying B. Etching of the Structures by:
dip methods (for example wet etching in wet-chemistry benches): dipping of the substrates into the etching bath, etching operation, repeated rinsing in $H_2O$ cascade sinks, drying spin-on or spray methods: the etching solution is applied to a rotating substrate, the etching operation can be carried out without/with input of energy (for example IR or UV irradiation), this is followed by rinsing and drying dry-etching methods, such as, for example, plasma etching, in expensive vacuum units or etching with reactive gases in flow reactors C. Removal of the Photoresist:
In the final process step, the photoresist covering the protecting areas of the substrate must be removed. This can be carried out by means of solvents, such as, for example, acetone, or dilute aqueous alkaline solutions. The substrates are finely rinsed and dried.

Full-Area Etching of Silicon Oxide- and Silicon Nitride-Based Glasses and Other Silicon Oxide- and Silicon Nitride-Based Systems:

In order to etch silicon oxide- and silicon nitride-based glasses and other silicon oxide- and silicon nitride-based systems and layers of variable thickness thereof over the entire area completely or only to a certain depth, use is predominantly made of wet-etching methods. The silicon oxide- and silicon nitride-based glasses and other silicon oxide- and silicon nitride-based systems and layers of variable thickness thereof are dipped into etching baths, which usually contain the toxic and highly caustic hydrofluoric acid and optionally additives of other mineral acids.

The disadvantages of the etching methods described lie in the time-consuming, material-intensive and expensive process steps which are in some cases complex in technological and safety terms and are frequently carried out discontinuously.

International Application WO 01/83391 A describes etching media in the form of printable, homogeneous, particle-free etching pastes having non-Newtonian flow behaviour for the etching of inorganic, glass-like amorphous or crystalline surfaces, in particular of glasses or ceramics, preferably $SiO_2$— or silicon nitride-based systems, and the use of these etching media. In particular on printing of surfaces, use of these particle-free media gave rise to problems due to inadequate resilience of the printed lines, dots or structures (inadequate structure fidelity), meaning that a significant broadening of the originally printed lines occurs (bleeding of the etching species on the substrate).

U.S. Pat. No. 5,688,366 A uses particle-containing etching pastes for the etching of a transparent conductive layer (for example ITO). The etching pastes used are prepared from molten iron chloride containing water of crystallisation, glycerol and polymer particles. These compositions are suitable for the etching of lines having a width of about 1 mm. Experiments have shown that these etching pastes are not suitable for the etching of very thin lines having a width of less than 1 mm cleanly and without flaws, irrespective of whether polymer particles having a diameter of 0.01 µm or of 30 µm are employed for the preparation of the pastes.

OBJECTIVE

The object of the present invention is therefore to provide novel, inexpensive etching pastes for the etching of very uniform, thin lines having a width of less than 100 µm, in particular of less than 80 µm, and of microfine structures on silicon dioxide and/or silicon nitride layers which are located on silicon solar cells. A further object of the present invention is to provide novel etching media which can be removed from the treated surfaces after the etching under the action of heat in a simple manner without leaving residues.

2. DESCRIPTION OF THE INVENTION

More recent experiments have now shown that, in contrast to previous experience, the printing properties of etching pastes can advantageously be improved if suitable, selected polymer particles are added. In this connection, polymer particles which form a network in the prepared pastes through physical interaction and/or chemical reaction with the other constituents of the medium, simultaneously causing an increase in the viscosity of the composition, have proven particularly suitable. Entirely unexpectedly, the added particles also contribute to an improvement in the printability of the medium.

Given a suitable choice of the added particulate components, it may even be possible to omit entirely the addition of a thickener, which is usually homogeneously distributed in known particle-free pastes.

The object of the present application is therefore achieved by the provision of a novel printable etching medium having non-Newtonian flow behaviour in the form of an etching paste for the etching of inorganic, glass-like or crystalline surfaces selected from the group of glasses based on silicon oxide and glasses based on silicon nitride, which comprises polymer particles consisting of a material selected from the group of polystyrene, polyacryl, polyamide, polyimide, polymethacrylate, melamine, urethane, benzoguanine, phenolic resin, silicone resin, fluorinated polymers (PTFE, PVDF, inter alia) and micronised wax, in the presence of an etching component, solvent, thickener, optionally at least one inorganic and/or organic acid, and optionally additives, such as antifoams, thixotropic agents, flow-control agents, deaerators, adhesion promoters. The etching medium according to the invention is effective even at temperatures of 15 to 50° C. or can optionally be activated by input of energy. Preferred forms of the pastes according to the invention and use thereof arise from claims 2-18. The present invention furthermore relates to a process for the etching and optionally for the simultaneous doping of inorganic, glass-like, crystalline surfaces according to claims 29 and 33. Claim 28 relates to particular embodiments of the use of the etching pastes according to the invention.

3. DETAILED DESCRIPTION OF THE INVENTION

In accordance with the invention, the novel etching pastes having thixotropic, non-Newtonian properties are used to structure silicon dioxide or nitride layers in a suitable manner during the process for the production of products for photovoltaics, semiconductor technology, high-performance electronics, of solar cells or photodiodes. To this end, the paste is printed in a single process step onto the surface to be etched and removed again after a pre-specified reaction time. In this way, the surface is etched and structured in the printed areas, while unprinted areas remain in the original state.

The surface to be etched here can be a surface or part-surface of silicon oxide- or silicon nitride-based glass and other silicon oxide- and silicon nitride-based systems, and/or a surface or part-surface of a porous and non-porous layer of glass and other silicon oxide- and silicon nitride-based systems on a support material.

A suitable process having a high degree of automation and having high throughput utilises printing technology for the transfer of the etching paste to the substrate surface to be etched. In particular, the screen, pad, stamp, ink-jet printing processes are printing processes that are known to the person skilled in the art. Manual application is likewise possible.

Depending on the screen, plate or stamp design or cartridge addressing, it is possible to apply the printable, homogeneous, particle-free etching pastes having non-Newtonian flow behaviour which are described in accordance with the invention over the entire area or selectively in accordance with the etch structure pattern only in the areas where etching is desired. All masking and lithography steps which are otherwise necessary are thus superfluous. The etching operation can be carried out with or without energy input, for example in the form of heat radiation (using IR lamps).

The actual etching process is subsequently completed by washing the surfaces with water and/or a suitable solvent. More precisely, the printable, polymer particle-containing etching pastes having non-Newtonian flow behaviour are rinsed off the etched areas using a suitable solvent after etching is complete.

Use of the etching pastes according to the invention thus enables long runs to be etched inexpensively on an industrial scale in a suitable, automated process.

In a preferred embodiment, the etching paste according to the invention has a viscosity in the range from 10 to 500 Pa·s, preferably from 50 to 200 Pa·s. The viscosity is the material-dependent component of the frictional resistance which counters movement when adjacent liquid layers are displaced. According to Newton, the shear resistance in a liquid layer between two sliding surfaces arranged parallel and moved relative to one another is proportional to the velocity or shear gradient G. The proportionality factor is a material constant which is known as the dynamic viscosity and has the dimension m Pa·s. In Newtonian liquids, the proportionality factor is pressure- and temperature-dependent. The degree of dependence here is determined by the material composition. Liquids or substances having an inhomogeneous composition have non-Newtonian properties. The viscosity of these substances is additionally dependent on the shear gradient.

For the etching of fine structures, having line widths of <100 µm, by printed etching media, it has now been found to be particularly advantageous to thicken etching media completely or partially using finely divided particulate systems instead of particle-free etching pastes comprising a homogeneously distributed polymer (types see WO 01/83391 A) for thickening. Particularly suitable for this purpose are polymer particles which interact with the other components of the composition and form a network by means of chemical bonds or a purely physical interaction at the molecular level. The relative particle diameters of these systems can be in the range from 10 nm to 30 µm. Corresponding polymer particles having a relative particle diameter in the range from 1 to 10 μm have proved particularly advantageous. Particles which are particularly suitable for the purpose according to the invention can consist of the following materials:

polystyrene
polyacryl
polyamide
polyethylene
ethylene-vinyl acetate copolymer
ethylene-acrylic acid-acrylate terpolymer
ethylene-acrylate-maleic anhydride terpolymer
polypropylene
polyimide
polymethacrylate
melamine, urethane, benzoguanine, phenolic resin
silicone resin
fluorinated polymers (PTFE, PVDF), and
micronised waxes The use of a very finely divided polyethylene powder, which is, for example, currently marketed by DuPont PolymerPowders Switzerland under the trade name COATHYLENE HX® 1681, having relative particle diameters $d_{50}$ value of 10 μm, has proven particularly suitable in the experiments.

These particulate thickeners can be added to the etching medium in amounts of 1 to 50% by weight, advantageously in the range from 10 to 50% by weight, in particular from 25 to 35% by weight.

Also suitable in principle are particulate polymeric thickeners based on polystyrene
polyacryl
polyamide
polyimide
polymethacrylate
melamine, urethane, benzoguanine, phenolic resin
silicone resin.

Compared with the particle-free etching pastes described in WO 01/83391 A, the addition of the particulate thickeners according to the invention has enabled the following improvements to be achieved:

I. Particulate thickening results in improved resilience of the etching medium. The particles form a skeleton-structure in the etching medium. Similar structures are known to the person skilled in the art from highly dispersed silicic acid (for example Aerosil®). In particular in screen printing of the etching pastes, a broadening of the printed structures due to flow can be substantially prevented or at least greatly restricted by the present invention. The printed, and thus paste-covered area therefore corresponds substantially to the area specified in the screen layout. Many inorganic particles, such as, for example, silicic acid or modified silicic acid, cannot be employed for thickening the etching medium owing to their reactivity with the etching component employed. For example, a chemical reaction of silicic acid with $NH_4HF_2$ takes place if the latter serves as etching component.

II. With the aid of particulate thickening, lines of greater print height with retained width are, in addition, printed on use of the same screen or mask than on use of corresponding particle-free pastes, as described, for example, in WO 01/83391 A. This simultaneously results in a greater application rate of etching component per unit area. If relatively thick silicon dioxide or silicon nitride layers (>100 nm) are to be etched, this is a particular advantage for complete etching.

III. The more pronounced non-Newtonian or thixotropic properties of the etching paste have a particularly advantageous effect for screen printing and result in considerably improved results. In particular, this is evident in a shortened etching time or an increased etching rate for the same etching time and especially in a greater etching depth in the case of relatively thick layers.

IV. The thickening associated with the addition of polymer particles according to the invention results in a considerably lower binding capacity of the etching paste. Given a specific choice of the particles added, an increased etching rate and thus a considerably increased etching depth are, surprisingly, achieved for the same amount of added etching component.

V. The significantly greater print height achieved under the same printing conditions, i.e. on use of the same screen and the same printing parameters, furthermore causes significantly delayed drying of the printed etching species. This enables the etching species to act on the substrate for longer. It is particularly important in the case of accelerated etching under elevated temperatures. In addition, the material remaining after the etching process can be removed significantly more easily in the final cleaning process.

Significant improvements in the present compositions arise, in particular, through a considerably improved screen-printing behaviour, enabling continuous printing of surfaces to be treated without interruptions. The use of the etching pastes according to the invention enables considerably finer etching structures since the pastes have greater viscosities on addition of the same amounts of thickener in the presence of polymer particles. This enables the pastes to be applied in printing with a higher paste layer and consequently for the layers to be etched deeper. The improved rinsing behaviour (wafer cleaning) after etching also shortens the time required for subsequent cleaning.

Surprisingly, experiments have shown that the addition of corresponding fine polymer particles also has an advantageous effect in processes for the selective etching of inorganic surfaces for the production of selective emitter structures in solar cells, in which, besides etching, specific phosphorus doping for the production of $n^{++}$ regions is also desired. Corresponding etching and doping pastes are described, for example, in WO 03/034504 A1. In contrast to the pure etching pastes, these pastes, after application to the wafer surfaces to be etched, are heated over the entire surface or locally depending on the particles present in the paste to temperatures in the range from 250 to 350° C. for from 30 to 120 seconds and optionally, for additional $n^{++}$ doping, to temperatures >800° C., in particular to temperatures in the range from 800 to 1050° C., for 20-40 minutes. The selected temperature is of course set in such a way that changes in the particles present in the paste do not give rise to any disadvantages.

Corresponding etching media may comprise the various forms of phosphoric acid or suitable phosphoric acid salts or compounds, which are decomposed to the corresponding phosphoric acid on heating, as etching and as doping components.

It has been found that orthophosphoric acid, metaphosphoric acid, pyrophosphoric acid and salts thereof and here in particular the ammonium salts (($NH_4$)$_2HPO_4$, $NH_4H_2PO_4$, ($NH_4$)$_3PO_4$) and other compounds which form one of these compounds on thermal decomposition are capable of completely etching away silicon nitride layers having a layer thickness of 70 mm within a few seconds to minutes at temperatures above 250° C. At 300° C., the etching time is about 60 seconds.

For the preparation of the particle-containing media according to the invention, the solvents, etching components, thickeners, particles and additives are mixed successively with one another and stirred for a sufficient time until a viscous paste having thixotropic properties has formed. The stirring can be carried out with warming to a suitable temperature. The components are usually stirred with one another at room temperature.

Preferred uses of the printable etching pastes according to the invention arise for the described processes for the structuring of oxide layers applied to a support material, for the production of solar cells having a selective emitter layer on the light incidence side and for the production of solar cells having a selective emitter layer on the light incidence side and a back-surface field on the back.

For application of the pastes to the areas to be treated, the etching pastes can be printed through a fine-mesh screen which contains the print template (or etched metal screen). In a further step, the pastes can be baked in the screen-printing process by the thick-layer method (screen printing of conductive metal pastes), enabling the electrical and mechanical properties to be fixed. On use of the etching pastes according to the invention, the baking (firing through the dielectric layers) can instead also be omitted and the applied etching pastes washed off with a suitable solvent or solvent mixture after a certain reaction time. The etching action is terminated by the washing-off.

Particularly suitable printing methods are essentially screen printing with screen separation or stencil printing without separation. In screen printing, the separation a of a screen is usually several hundred µm with a tilt angle α between the edge of the squeegee, which pushes the etching printing paste over the screen, and the screen. The screen is held by a screen frame, while the squeegee is passed over the screen at a squeegee velocity v and a squeegee pressure P. In the process, the etching paste is pushed over the screen. During this operation, the screen comes into contact with the substrate in the form of a line over the squeegee width. The contact between screen and substrate transfers the vast majority of the screen printing paste located in the free screen meshes onto the substrate. In the areas covered by the screen meshes, no screen printing paste is transferred onto the substrate. This enables screen printing paste to be transferred in a targeted manner to certain areas of the substrate.

After the end of the movement E, the squeegee is raised off the screen. The screen is tensioned uniformly using a screen stretcher with hydraulic/pneumatic tension and clamping device. The screen tension is monitored by defined sag of the screen in a certain area at a certain weight using a dial gauge. With specific pneumatic/hydraulic printing machines, the squeegee pressure (P), the printing velocity (V), the off-contact distance (A) and the squeegee path (horizontal and vertical, squeegee angle) can be set with various degrees of automation of the working steps for trial and production runs.

Printing screens used here usually consist of plastic or steel-wire cloth. It is possible for the person skilled in the art to select cloths having different wire diameters and mesh widths, depending on the desired layer thickness and line width. These cloths are structured directly or indirectly using photosensitive materials (emulsion layer). For the printing of extremely fine lines and in the case of requisite high precision of successive prints, it may be advantageous to use metal stencils, which are likewise provided directly or indirectly with a hole structure or line structure.

In order to carry out the etching, an etching paste, as described, for example, in Example 1, is prepared. Using an etching paste of this type, a thermal $SiO_2$ having a thickness of approx. 100 nm can be removed selectively within 60 seconds at 50° C. after screen printing. The etching is subsequently terminated by dipping the Si wafer into water and then rinsing with the aid of a fine water spray.

For the production of solar cells, wafers comprising p-doped Pz silicon having <100> orientation, for example, are selected. In these, a short, basic etching enables a structure to be produced on the surface which improves the light incidence geometry for reducing reflections. A thin dopant coating film comprising a boron-containing compound can be spin-coated onto the back and dried. The wafers prepared in this way are placed in a tray and introduced into an oven pre-heated to 1000 to 1100° C. An oxygen atmosphere is established in the oven, so that an oxide layer forms directly on all wafer surfaces that are not covered by the boron dopant coating film. At the same time, boron is expelled from the dopant coating film and diffuses into the back of the wafers. p+-doped regions with a depth of approx. 1 to 5 µm form. This embodiment of a solar cell is known to the person skilled in the art under the term "back-surface field". The oxide layers formed on the front can now be structured using the etching pastes described above.

For example, these oxide layers can be formed as masks for high n+-phosphorus dopings for the formation of selective emitter layers, while significantly less n+-doping is aimed at in the masked areas.

After opening of the pn junction, which would result in short circuits in the solar cell, for example by plasma etching or opening using a LASER beam, the electrical contacts are applied to the front and back of the cell. This can be carried out by means of two successive screen-printing steps using a paste, which may, besides the binders and oxidic additives, comprise conductive silver particles and/or aluminium. After the printing, the printed contacts are baked at about 700 to 800° C.

The present description enables the person skilled in the art to use the invention comprehensively. If anything is unclear, it goes without saying that the cited publications and patent literature should be used. Correspondingly, these documents are regarded as part of the disclosure content of the present description.

4. EXAMPLES

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

The temperatures given in the examples are always in ° C. It furthermore goes without saying that the added amounts of the components in the composition always add up to a total of 100% both in the description and in the examples.

Example 1

Etching Paste Consisting of Homogeneous and Particulate Thickeners

To a solvent mixture consisting of 15 g of ethylene glycol monobutyl ether 15 g of triethylene glycol monomethyl ether 29 g of polycarbonate are added successively with stirring 72 g of formic acid (100%) and 46 g of ammonium hydrogen difluoride solution 35%.

Then 46 g of polyvinylpyrrolidone (PVP) K-120 are slowly added in portions to the solution with vigorous stirring, and the mixture is stirred for a further 30 minutes. The clear paste pre-thickened with a homogeneous thickener (PVP) is then mixed with 60 g of Vestosint 2070 and the mixture is stirred for a further 2 hours.

The paste, which is now ready to use, can be printed using a 280 mesh stainless-steel cloth screen. In principle, polyester or similar screen materials can also be used.

Example 2

Etching Paste Consisting of a Particulate Thickener to a Solvent Mixture Consisting of 15 g of ethylene glycol monobutyl ether 15 g of triethylene glycol monomethyl ether 29 g of polycarbonate are added successively with stirring 72 g of formic acid (100%) and 46 g of ammonium hydrogen difluoride solution 35%.

The clear homogeneous mixture is then mixed with 100 g of Vestosint 2070, and the mixture is stirred for a further 2 hours.

The paste, which is now ready to use, can be printed using a 280 mesh stainless-steel cloth screen. In principle, polyester or similar screen materials can also be used.

The etching paste prepared has proven to be stable on storage over a long time with retention of the advantageous etching properties.

Further examples of compositions according to the invention having advantageous properties are given in the following tables:

| Batch | Ethylene glycol monomethyl ether [g] | Triethylene glycol monomethyl ether [g] | Propylene carbonate [g] | PEG 600 [g] | NH4HF2 [g] | NH4F [g] | HF (40%) [g] | H2O [g] | CH3COOH (100%) [g] | HCOOH (100%) [g] | PVP K90 [g] | Natrosol GR250 [g] | Vestosint PA 2070 [g] | CaF2 [g] |
|---|---|---|---|---|---|---|---|---|---|---|---|---|---|---|
| 1 | 12 | 10 | 20 | 0 | 17 | 0 | 0 | 21 | 0 | 50 | 9 | 0 | 50 | 0 |
| 2 | 11 | 11 | 21.8 | 0 | 19.2 | 0 | 0 | 20 | 0 | 49 | 9 | 0 | 70 | 0 |
| 3 | 11 | 11 | 21.8 | 0 | 19.2 | 0 | 0 | 20 | 0 | 49 | 12 | 0 | 50 | 0 |
| 4 | 11 | 11 | 21.8 | 0 | 19.2 | 0 | 0 | 20 | 0 | 49 | 15 | 0 | 50 | 0 |
| 5 | 11 | 0 | 32.8 | 0 | 19.2 | 0 | 0 | 20 | 0 | 49 | 9 | 0 | 70 | 0 |
| 6 | 0 | 0 | 43.8 | 0 | 19.2 | 0 | 0 | 20 | 0 | 49 | 9 | 0 | 70 | 0 |
| 7 | 33.8 | 0 | 0 | 10 | 19.2 | 0 | 0 | 20 | 0 | 49 | 9 | 0 | 70 | 0 |
| 8 | 11 | 11 | 21.8 | 0 | 19.2 | 0 | 0 | 20 | 0 | 49 | 9 | 0 | 60 | 0 |
| 9 | 11 | 11 | 21.8 | 0 | 19.2 | 0 | 0 | 20 | 0 | 49 | 9 | 0 | 50 | 0 |
| 10 | 11 | 11 | 21.8 | 0 | 19.2 | 0 | 0 | 20 | 0 | 49 | 9 | 0 | 65 | 0 |
| 11 | 11 | 11 | 21.8 | 0 | 19.2 | 0 | 0 | 20 | 0 | 49 | 12 | 0 | 60 | 0 |
| 12 | 11 | 11 | 21.8 | 0 | 19.2 | 0 | 0 | 20 | 0 | 49 | 12 | 0 | 65 | 0 |
| 13 | 11 | 11 | 21.8 | 0 | 19.2 | 0 | 0 | 20 | 0 | 49 | 12 | 0 | 70 | 0 |
| 14 | 11 | 11 | 21.8 | 0 | 19.2 | 0 | 0 | 20 | 0 | 49 | 15 | 0 | 60 | 0 |
| 15 | 11 | 11 | 21.8 | 0 | 19.2 | 0 | 0 | 20 | 0 | 49 | 15 | 0 | 65 | 0 |
| 16 | 11 | 11 | 21.8 | 0 | 19.2 | 0 | 0 | 20 | 0 | 49 | 15 | 0 | 70 | 0 |
| 17 | 11 | 11 | 21.8 | 0 | 21.4 | 0 | 0 | 22.3 | 0 | 54.5 | 20 | 0 | 60 | 0 |
| 18 | 11 | 11 | 21.8 | 0 | 21.4 | 0 | 0 | 22.3 | 0 | 54.5 | 20 | 0 | 50 | 0 |
| 19 | 11 | 11 | 21.8 | 0 | 21.4 | 0 | 0 | 22.3 | 0 | 54.5 | 20 | 0 | 70 | 0 |
| 20 | 11 | 0 | 32.8 | 0 | 21.4 | 0 | 0 | 22.3 | 0 | 54.5 | 20 | 0 | 60 | 0 |
| 21 | 0 | 0 | 43.8 | 0 | 21.4 | 0 | 0 | 22.3 | 0 | 54.5 | 20 | 0 | 60 | 0 |
| 22 | 0 | 0 | 33.8 | 10 | 21.4 | 0 | 0 | 22.3 | 0 | 54.5 | 20 | 0 | 60 | 0 |
| 23 | 62 | 62 | 123 | 0 | 120 | 0 | 0 | 125 | 0 | 305 | 113 | 0 | 282 | 0 |
| 24 | 11 | 0 | 32.8 | 0 | 21.4 | 0 | 0 | 22.3 | 0 | 54.5 | 20 | 0 | 50 | 0 |
| 25 | 0 | 0 | 43.8 | 0 | 21.4 | 0 | 0 | 22.3 | 0 | 54.5 | 20 | 0 | 50 | 0 |
| 26 | 0 | 0 | 33.8 | 10 | 21.4 | 0 | 0 | 22.3 | 0 | 54.5 | 20 | 0 | 50 | 0 |
| 27 | 11 | 11 | 21.8 | 0 | 21.4 | 0 | 0 | 22.3 | 0 | 54.5 | 20 | 0 | 49 | 0 |
| 28 | 11 | 11 | 21.8 | 0 | 21.4 | 0 | 0 | 22.3 | 0 | 54.5 | 20 | 0 | 48 | 0 |
| 29 | 11 | 11 | 21.8 | 0 | 21.4 | 0 | 0 | 22.3 | 0 | 54.5 | 20 | 0 | 47 | 0 |
| 30 | 11 | 11 | 21.8 | 0 | 21.4 | 0 | 0 | 22.3 | 0 | 54.5 | 20 | 0 | 46 | 0 |
| 31 | 11 | 11 | 21.8 | 0 | 21.4 | 0 | 0 | 22.3 | 0 | 54.5 | 20 | 0 | 0 | 70 |
| 32 | 0 | 0 | 60 | 0 | 21.4 | 0 | 0 | 22.3 | 0 | 54.5 | 20 | 0 | 50 | 0 |
| 33 | 0 | 0 | 70 | 0 | 21.4 | 0 | 0 | 22.3 | 0 | 54.5 | 20 | 0 | 50 | 0 |
| 34 | 11 | 11 | 21.8 | 0 | 21.4 | 0 | 0 | 32.3 | 0 | 44.5 | 20 | 0 | 50 | 0 |
| 35 | 11 | 11 | 21.8 | 0 | 21.4 | 0 | 0 | 38.4 | 0 | 38.4 | 20 | 0 | 50 | 0 |
| 36 | 0 | 0 | 43.8 | 0 | 21.4 | 0 | 0 | 22.3 | 0 | 54.5 | 20 | 0 | 50 | 0 |
| 37 | 0 | 0 | 33.8 | 10 | 21.4 | 0 | 0 | 22.3 | 0 | 54.5 | 20 | 0 | 50 | 0 |
| 38 | 11 | 11 | 21.8 | 0 | 21.4 | 0 | 0 | 22.3 | 0 | 54.5 | 20 | 0 | 50 | 0 |
| 39 | 0 | 0 | 60 | 0 | 21.4 | 0 | 0 | 0 | 0 | 60 | 20 | 0 | 50 | 0 |
| 40 | 0 | 0 | 43.8 | 0 | 21.4 | 0 | 0 | 22.3 | 0 | 54.5 | 20 | 0 | 0 | 0 |
| 41 | 0 | 0 | 48.8 | 0 | 21.4 | 0 | 0 | 22.3 | 0 | 49.5 | 20 | 0 | 50 | 0 |
| 42 | 0 | 0 | 38.8 | 5 | 21.4 | 0 | 0 | 22.3 | 0 | 54.5 | 20 | 0 | 50 | 0 |
| 43 | 0 | 0 | 43.8 | 0 | 21.4 | 0 | 0 | 0 | 22.3 | 54.5 | 20 | 0 | 25 | 0 |
| 44 | 0 | 0 | 43.8 | 0 | 21.4 | 0 | 0 | 0 | 38.4 | 38.4 | 20 | 0 | 25 | 0 |
| 45 | 0 | 0 | 247 | 0 | 120 | 0 | 0 | 125 | 0 | 305 | 113 | 0 | 282 | 0 |

-continued

| | | | | | | | | | | | | | | |
|---|---|---|---|---|---|---|---|---|---|---|---|---|---|---|
| 46 | 0 | 0 | 43.8 | 0 | 21.4 | 0 | 0 | 22.3 | 0 | 54.5 | 20 | 0 | 0 | 0 |
| 47 | 0 | 0 | 43.8 | 0 | 21.4 | 10 | 0 | 12.3 | 0 | 54.5 | 20 | 0 | 0 | 0 |
| 48 | 0 | 0 | 43.8 | 0 | 21.4 | 0 | 10 | 12.3 | 0 | 54.5 | 20 | 0 | 0 | 0 |
| 49 | 0 | 0 | 43.8 | 0 | 21.4 | 0 | 5 | 17.3 | 0 | 54.5 | 20 | 0 | 0 | 0 |
| 50 | 0 | 0 | 43.8 | 0 | 21.4 | 0 | 5 | 22.3 | 0 | 49.5 | 20 | 0 | 0 | 0 |
| 51 | 0 | 0 | 43.8 | 0 | 21.4 | 0 | 3.5 | 22.3 | 0 | 51.5 | 20 | 0 | 0 | 0 |
| 52 | 0 | 0 | 33.8 | 10 | 21.4 | 0 | 3.5 | 22.3 | 0 | 51.5 | 20 | 0 | 0 | 0 |
| 53 | 0 | 0 | 22 | 22 | 21.4 | 0 | 3.5 | 22.3 | 0 | 51.5 | 20 | 0 | 0 | 0 |
| 54 | 0 | 0 | 30 | 30 | 21.4 | 0 | 3.5 | 22.3 | 0 | 35 | 20 | 0 | 0 | 0 |
| 55 | 11 | 11 | 21.8 | 0 | 21.4 | 0 | 0 | 22.3 | 0 | 54.5 | 20 | 0 | 0 | 0 |
| 56 | 11 | 11 | 21.8 | 0 | 21.4 | 0 | 3.5 | 22.3 | 0 | 51.5 | 20 | 0 | 0 | 0 |
| 57 | 0 | 0 | 43.8 | 0 | 21.4 | 0 | 0 | 22.3 | 0 | 54.5 | 0 | 3 | 0 | 0 |
| 58 | 11 | 11 | 21.8 | 0 | 21.4 | 0 | 0 | 22.3 | 0 | 54.5 | 0 | 3 | 0 | 0 |
| 59 | 0 | 0 | 43.8 | 0 | 21.4 | 0 | 0 | 22.3 | 0 | 54.5 | 0 | 1 | 0 | 0 |
| 60 | 11 | 11 | 21.8 | 0 | 21.4 | 0 | 0 | 22.3 | 0 | 54.5 | 0 | 1 | 0 | 0 |
| 61 | 0 | 0 | 43.8 | 0 | 21.4 | 0 | 0 | 22.3 | 0 | 54.5 | 0 | 1.5 | 0 | 0 |
| 62 | 0 | 0 | 124 | 124 | 120 | 0 | 19.7 | 125 | 0 | 290 | 113 | 0 | 282 | 0 |
| 63 | 0 | 0 | 22 | 22 | 21.4 | 0 | 3.5 | 22.3 | 0 | 51.5 | 20 | 0 | 40 | 0 |
| 64 | 0 | 0 | 22 | 22 | 21.4 | 0 | 3.5 | 22.3 | 0 | 51.5 | 20 | 0 | 30 | 0 |
| 65 | 0 | 0 | 124 | 124 | 120 | 0 | 19.7 | 125 | 0 | 209 | 113 | 0 | 225 | 0 |
| 66 | 0 | 0 | 43.8 | 0 | 21.4 | 0 | 0 | 22.3 | 0 | 54.5 | 0 | 1 | 50 | 0 |
| 67 | 11 | 11 | 21.8 | 0 | 21.4 | 0 | 0 | 22.3 | 0 | 54.5 | 0 | 1 | 50 | 0 |
| 68 | 0 | 0 | 22 | 22 | 21.4 | 0 | 3.5 | 22.3 | 0 | 51.5 | 0 | 1 | 50 | 0 |
| 69 | 11 | 11 | 21.8 | 0 | 24.6 | 0 | 0 | 47.1 | 0 | 26.5 | 20 | 0 | 50 | 0 |
| 70 | 11 | 11 | 21.8 | 0 | 24.6 | 0 | 0 | 36.8 | 0 | 36.8 | 20 | 0 | 50 | 0 |
| 71 | 11 | 11 | 21.8 | 0 | 24.6 | 0 | 0 | 29.5 | 0 | 44.1 | 20 | 0 | 50 | 0 |
| 72 | 11 | 11 | 21.8 | 0 | 19.2 | 0 | 0 | 20 | 0 | 49 | 12 | 0 | 60 | 0 |
| 73 | 11 | 11 | 21.8 | 0 | 19.2 | 0 | 0 | 20 | 0 | 49 | 9 | 0 | 60 | 0 |
| 74 | 0 | 0 | 43.8 | 0 | 19.2 | 0 | 0 | 20 | 0 | 49 | 9 | 0 | 60 | 0 |
| 75 | 0 | 0 | 22 | 22 | 19.2 | 0 | 0 | 20 | 0 | 49 | 9 | 0 | 60 | 0 |
| 76 | 11 | 11 | 21.8 | 0 | 21.4 | 0 | 0 | 22.3 | 0 | 54.5 | 9 | 0 | 60 | 0 |
| 77 | 11 | 11 | 21.8 | 0 | 21.4 | 0 | 3.5 | 22.3 | 0 | 51.5 | 9 | 0 | 60 | 0 |
| 78 | 0 | 0 | 248 | 0 | 109 | 0 | 0 | 113 | 0 | 277 | 51 | 0 | 340 | 0 |
| 79 | 0 | 0 | 43.8 | 0 | 21.4 | 0 | 0 | 22.3 | 0 | 54.5 | 0 | 3 | 20 | 0 |
| 80 | 0 | 0 | 43.8 | 0 | 21.4 | 0 | 0 | 22.3 | 0 | 54.5 | 0 | 2.5 | 21 | 0 |
| 81 | 0 | 0 | 43.8 | 0 | 21.4 | 0 | 0 | 22.3 | 0 | 54.5 | 0 | 2 | 22 | 0 |
| 82 | 6.2 | 18.6 | 18.6 | 0 | 19.2 | 0 | 0 | 20 | 0 | 49 | 9 | 0 | 60 | 0 |
| 83 | 6.2 | 18.6 | 18.6 | 0 | 19.2 | 0 | 0 | 20 | 0 | 49 | 12 | 0 | 60 | 0 |
| 84 | 6.2 | 18.6 | 18.6 | 5 | 19.2 | 0 | 0 | 20 | 0 | 49 | 9 | 0 | 60 | 0 |
| 85 | 0 | 14.5 | 28.9 | 0 | 19.2 | 0 | 0 | 20 | 0 | 49 | 9 | 0 | 50 | 0 |
| 86 | 0 | 0 | 45 | 0 | 19.2 | 0 | 0 | 20 | 0 | 49 | 9 | 0 | 50 | 0 |
| 87 | 0 | 14.5 | 28.9 | 5 | 19.2 | 0 | 0 | 20 | 0 | 49 | 9 | 0 | 50 | 0 |
| 88 | 0 | 14.5 | 28.9 | 0 | 19.2 | 0 | 0 | 20 | 0 | 49 | 9 | 0 | 50 | 0 |
| 89 | 0 | 14.5 | 28.9 | 0 | 21.4 | 0 | 0 | 22.3 | 0 | 51.5 | 12 | 0 | 50 | 0 |
| 90 | 0 | 14.5 | 28.9 | 0 | 23.6 | 0 | 0 | 24.6 | 0 | 54 | 15 | 0 | 50 | 0 |
| 91 | 0 | 14.5 | 28.9 | 0 | 25.8 | 0 | 0 | 26.9 | 0 | 56.5 | 18 | 0 | 50 | 0 |
| 92 | 0 | 14.5 | 28.9 | 0 | 28 | 0 | 0 | 29.2 | 0 | 59 | 21 | 0 | 50 | 0 |
| 93 | 0 | 0 | 0 | 0 | 125 | 0 | 0 | 306 | 88 | 0 | 0 | 7 | 0 | 0 |
| 94 | 0 | 0 | 0 | 0 | 126 | 0 | 0 | 305 | 87 | 0 | 0 | 8 | 0 | 0 |
| 95 | 0 | 0 | 0 | 0 | 127 | 0 | 0 | 304 | 86 | 0 | 0 | 9 | 0 | 0 |
| 96 | 0 | 0 | 0 | 0 | 128 | 0 | 0 | 303 | 85 | 0 | 0 | 10 | 0 | 0 |
| 97 | 0 | 0 | 0 | 0 | 129 | 0 | 0 | 302 | 84 | 0 | 0 | 11 | 0 | 0 |
| 98 | 0 | 0 | 0 | 0 | 130 | 0 | 0 | 301 | 83 | 0 | 0 | 12 | 0 | 0 |
| 99 | 0 | 0 | 0 | 0 | 131 | 0 | 0 | 300 | 82 | 0 | 0 | 13 | 0 | 0 |
| 100 | 0 | 0 | 0 | 0 | 132 | 0 | 0 | 299 | 81 | 0 | 0 | 14 | 0 | 0 |
| 101 | 0 | 0 | 0 | 0 | 133 | 0 | 0 | 298 | 80 | 0 | 0 | 15 | 0 | 0 |
| 102 | 0 | 0 | 0 | 0 | 134 | 0 | 0 | 297 | 79 | 0 | 0 | 16 | 0 | 0 |
| 103 | 0 | 0 | 0 | 0 | 135 | 0 | 0 | 296 | 78 | 0 | 0 | 17 | 0 | 0 |
| 104 | 0 | 0 | 0 | 0 | 136 | 0 | 0 | 295 | 77 | 0 | 0 | 18 | 0 | 0 |
| 105 | 0 | 0 | 0 | 0 | 137 | 0 | 0 | 294 | 76 | 0 | 0 | 19 | 0 | 0 |
| 106 | 0 | 0 | 0 | 0 | 138 | 0 | 0 | 293 | 75 | 0 | 0 | 20 | 0 | 0 |
| 107 | 0 | 0 | 0 | 0 | 139 | 0 | 0 | 292 | 74 | 0 | 0 | 21 | 0 | 0 |
| 108 | 0 | 0 | 0 | 0 | 140 | 0 | 0 | 291 | 73 | 0 | 0 | 22 | 0 | 0 |
| 109 | 0 | 0 | 0 | 0 | 141 | 0 | 0 | 290 | 72 | 0 | 0 | 23 | 0 | 0 |
| 110 | 0 | 0 | 0 | 0 | 142 | 0 | 0 | 289 | 71 | 0 | 0 | 24 | 0 | 0 |
| 111 | 0 | 0 | 0 | 0 | 143 | 0 | 0 | 288 | 70 | 0 | 0 | 25 | 0 | 0 |
| 112 | 0 | 0 | 0 | 0 | 144 | 0 | 0 | 287 | 69 | 0 | 0 | 26 | 0 | 0 |
| 113 | 0 | 0 | 0 | 0 | 145 | 0 | 0 | 286 | 68 | 0 | 0 | 27 | 0 | 0 |
| 114 | 0 | 0 | 0 | 0 | 146 | 0 | 0 | 285 | 67 | 0 | 0 | 28 | 0 | 0 |
| 115 | 0 | 0 | 0 | 0 | 147 | 0 | 0 | 284 | 66 | 0 | 0 | 29 | 0 | 0 |
| 116 | 0 | 0 | 0 | 0 | 148 | 0 | 0 | 283 | 65 | 0 | 0 | 30 | 0 | 0 |
| 117 | 0 | 15 | 15 | 0 | 9 | 0 | 0 | 25 | 0 | 28 | 12 | 0 | 33 | 0 |
| 118 | 0 | 16 | 14 | 0 | 8 | 0 | 0 | 26 | 0 | 29 | 11 | 0 | 32 | 0 |
| 119 | 0 | 17 | 13 | 0 | 7 | 0 | 0 | 27 | 0 | 30 | 10 | 0 | 31 | 0 |
| 120 | 0 | 18 | 12 | 0 | 6 | 0 | 0 | 28 | 0 | 31 | 9 | 0 | 30 | 0 |
| 121 | 0 | 19 | 11 | 0 | 5 | 0 | 0 | 29 | 0 | 32 | 8 | 0 | 29 | 0 |
| 122 | 0 | 20 | 10 | 0 | 5 | 0 | 0 | 30 | 0 | 33 | 7 | 0 | 28 | 0 |
| 123 | 0 | 21 | 9 | 0 | 5 | 0 | 0 | 31 | 0 | 34 | 6 | 0 | 27 | 0 |
| 124 | 28 | 0 | 0 | 0 | 5 | 0 | 0 | 0 | 0 | 0 | 0 | 0 | 64 | 0 |

-continued

| | | | | | | | | | | | | | | |
|---|---|---|---|---|---|---|---|---|---|---|---|---|---|---|
| 125 | 29 | 0 | 0 | 0 | 6 | 0 | 0 | 0 | 0 | 0 | 0 | 0 | 62 | 0 |
| 126 | 30 | 0 | 0 | 0 | 7 | 0 | 0 | 0 | 0 | 0 | 0 | 0 | 60 | 0 |
| 127 | 31 | 0 | 0 | 0 | 8 | 0 | 0 | 0 | 0 | 0 | 0 | 0 | 58 | 0 |
| 128 | 32 | 0 | 0 | 0 | 9 | 0 | 0 | 0 | 0 | 0 | 0 | 0 | 56 | 0 |
| 129 | 33 | 0 | 0 | 0 | 10 | 0 | 0 | 0 | 0 | 0 | 0 | 0 | 54 | 0 |
| 130 | 34 | 0 | 0 | 0 | 11 | 0 | 0 | 0 | 0 | 0 | 0 | 0 | 52 | 0 |
| 131 | 35 | 0 | 0 | 0 | 12 | 0 | 0 | 0 | 0 | 0 | 0 | 0 | 50 | 0 |
| 132 | 36 | 0 | 0 | 0 | 13 | 0 | 0 | 0 | 0 | 0 | 0 | 0 | 48 | 0 |
| 133 | 37 | 0 | 0 | 0 | 14 | 0 | 0 | 0 | 0 | 0 | 0 | 0 | 46 | 0 |
| 134 | 38 | 0 | 0 | 0 | 13 | 0 | 0 | 0 | 0 | 0 | 0 | 0 | 44 | 0 |
| 135 | 0 | 13 | 0 | 0 | 7 | 0 | 0 | 92 | 0 | 0 | 0 | 0 | 36 | 0 |
| 136 | 0 | 12 | 0 | 0 | 8 | 0 | 0 | 91 | 0 | 0 | 0 | 0 | 35 | 0 |
| 137 | 0 | 11 | 0 | 0 | 9 | 0 | 0 | 90 | 0 | 0 | 0 | 0 | 34 | 0 |
| 138 | 0 | 10 | 0 | 0 | 10 | 0 | 0 | 89 | 0 | 0 | 0 | 0 | 33 | 0 |
| 139 | 0 | 9 | 0 | 0 | 11 | 0 | 0 | 88 | 0 | 0 | 0 | 0 | 32 | 0 |
| 140 | 0 | 8 | 0 | 0 | 12 | 0 | 0 | 87 | 0 | 0 | 0 | 0 | 31 | 0 |
| 141 | 0 | 7 | 0 | 0 | 13 | 0 | 0 | 86 | 0 | 0 | 0 | 0 | 30 | 0 |
| 142 | 0 | 6 | 0 | 0 | 14 | 0 | 0 | 85 | 0 | 0 | 0 | 0 | 29 | 0 |
| 143 | 0 | 21 | 0 | 0 | 11 | 0 | 0 | 43 | 0 | 11 | 0 | 0 | 28 | 0 |
| 144 | 0 | 22 | 0 | 0 | 12 | 0 | 0 | 42 | 0 | 10 | 0 | 0 | 27 | 0 |
| 145 | 0 | 23 | 0 | 0 | 13 | 0 | 0 | 41 | 0 | 9 | 0 | 0 | 26 | 0 |
| 146 | 0 | 24 | 0 | 0 | 14 | 0 | 0 | 40 | 0 | 8 | 0 | 0 | 25 | 0 |
| 147 | 0 | 25 | 0 | 0 | 15 | 0 | 0 | 39 | 0 | 7 | 0 | 0 | 24 | 0 |
| 148 | 0 | 26 | 0 | 0 | 16 | 0 | 0 | 38 | 0 | 6 | 0 | 0 | 23 | 0 |
| 149 | 0 | 27 | 0 | 0 | 17 | 0 | 0 | 37 | 0 | 5 | 0 | 0 | 22 | 0 |
| 150 | 4 | 18 | 10 | 0 | 3.6 | 0 | 0 | 23 | 0 | 0 | 8 | 0 | 0 | 0 |
| 151 | 5 | 17 | 11 | 0 | 4.4 | 0 | 0 | 24 | 0 | 0 | 8.5 | 0 | 0 | 0 |
| 152 | 6 | 16 | 12 | 0 | 5.2 | 0 | 0 | 25 | 0 | 0 | 9 | 0 | 0 | 0 |
| 153 | 7 | 15 | 13 | 0 | 6 | 0 | 0 | 26 | 0 | 0 | 9.5 | 0 | 0 | 0 |
| 154 | 8 | 14 | 14 | 0 | 6.8 | 0 | 0 | 27 | 0 | 0 | 10 | 0 | 0 | 0 |
| 155 | 0 | 0 | 0 | | 97 | 0 | 23 | 224 | 0 | 0 | 77 | 0 | 0 | 0 |
| 156 | 0 | 0 | 0 | | 98 | 0 | 24 | 223 | 0 | 0 | 78 | 0 | 0 | 0 |
| 157 | 0 | 0 | 0 | | 99 | 0 | 25 | 222 | 0 | 0 | 79 | 0 | 0 | 0 |
| 158 | 0 | 0 | 0 | | 100 | 0 | 26 | 221 | 0 | 0 | 80 | 0 | 0 | 0 |
| 159 | 0 | 0 | 0 | | 101 | 0 | 27 | 220 | 0 | 0 | 81 | 0 | 0 | 0 |
| 160 | 0 | 0 | 0 | | 102 | 0 | 28 | 219 | 0 | 0 | 82 | 0 | 0 | 0 |
| 161 | 0 | 0 | 0 | | 103 | 0 | 29 | 218 | 0 | 0 | 83 | 0 | 0 | 0 |
| 162 | 0 | 0 | 0 | | 104 | 0 | 30 | 217 | 0 | 0 | 84 | 0 | 0 | 0 |
| 163 | 0 | 0 | 0 | | 105 | 0 | 31 | 216 | 0 | 0 | 85 | 0 | 0 | 0 |
| 164 | 0 | 0 | 0 | | 106 | 0 | 32 | 215 | 0 | 0 | 86 | 0 | 0 | 0 |
| 165 | 0 | 0 | 0 | | 107 | 0 | 33 | 214 | 0 | 0 | 87 | 0 | 0 | 0 |
| 166 | 0 | 0 | 0 | | 108 | 0 | 34 | 213 | 0 | 0 | 88 | 0 | 0 | 0 |
| 167 | 0 | 0 | 0 | | 109 | 0 | 35 | 212 | 0 | 0 | 89 | 0 | 0 | 0 |
| 168 | 0 | 0 | 0 | | 110 | 0 | 36 | 211 | 0 | 0 | 90 | 0 | 0 | 0 |
| 169 | 0 | 86 | 66 | 88 | 128 | 0 | 0 | 149 | 0 | 272 | 87 | 0 | 0 | 0 |
| 170 | 0 | 85 | 67 | 87 | 129 | 0 | 0 | 150 | 0 | 273 | 88 | 0 | 0 | 0 |
| 171 | 0 | 84 | 68 | 86 | 130 | 0 | 0 | 151 | 0 | 274 | 89 | 0 | 0 | 0 |
| 172 | 0 | 83 | 69 | 85 | 131 | 0 | 0 | 152 | 0 | 275 | 90 | 0 | 0 | 0 |
| 173 | 0 | 82 | 70 | 84 | 132 | 0 | 0 | 153 | 0 | 276 | 91 | 0 | 0 | 0 |
| 174 | 0 | 81 | 71 | 83 | 133 | 0 | 0 | 154 | 0 | 277 | 92 | 0 | 0 | 0 |
| 175 | 0 | 80 | 72 | 82 | 134 | 0 | 0 | 155 | 0 | 278 | 93 | 0 | 0 | 0 |
| 176 | 0 | 79 | 73 | 81 | 135 | 0 | 0 | 156 | 0 | 279 | 94 | 0 | 0 | 0 |
| 177 | 0 | 78 | 74 | 80 | 136 | 0 | 0 | 157 | 0 | 280 | 95 | 0 | 0 | 0 |
| 178 | 0 | 77 | 75 | 79 | 137 | 0 | 0 | 158 | 0 | 281 | 96 | 0 | 0 | 0 |
| 179 | 0 | 76 | 76 | 78 | 138 | 0 | 0 | 159 | 0 | 282 | 97 | 0 | 0 | 0 |
| 180 | 0 | 75 | 77 | 77 | 139 | 0 | 0 | 160 | 0 | 283 | 98 | 0 | 0 | 0 |
| 181 | 0 | 74 | 78 | 76 | 140 | 0 | 0 | 161 | 0 | 284 | 99 | 0 | 0 | 0 |
| 182 | 0 | 73 | 79 | 75 | 141 | 0 | 0 | 162 | 0 | 285 | 100 | 0 | 0 | 0 |
| 183 | 0 | 72 | 80 | 74 | 142 | 0 | 0 | 163 | 0 | 286 | 101 | 0 | 0 | 0 |
| 184 | 0 | 71 | 81 | 73 | 143 | 0 | 0 | 164 | 0 | 287 | 102 | 0 | 0 | 0 |
| 185 | 0 | 70 | 82 | 72 | 144 | 0 | 0 | 165 | 0 | 288 | 103 | 0 | 0 | 0 |
| 186 | 0 | 69 | 83 | 71 | 145 | 0 | 0 | 166 | 0 | 289 | 104 | 0 | 0 | 0 |
| 187 | 0 | 68 | 84 | 70 | 146 | 0 | 0 | 167 | 0 | 290 | 105 | 0 | 0 | 0 |
| 188 | 0 | 67 | 85 | 69 | 147 | 0 | 0 | 168 | 0 | 291 | 106 | 0 | 0 | 0 |
| 189 | 0 | 66 | 86 | 68 | 148 | 0 | 0 | 169 | 0 | 292 | 107 | 0 | 0 | 0 |
| 190 | 9 | 13 | 15 | 0 | 7.6 | 0 | 0 | 28 | 0 | 0 | 10.5 | 0 | 0 | 0 |
| 191 | 9 | 13 | 15 | 0 | 7.6 | 0 | 0 | 28 | 0 | 0 | 10.5 | 0 | 0 | 0 |
| 192 | 10 | 12 | 16 | 0 | 8.4 | 0 | 0 | 29 | 0 | 0 | 11 | 0 | 0 | 0 |
| 193 | 10 | 12 | 16 | 0 | 8.4 | 0 | 0 | 29 | 0 | 0 | 11 | 0 | 0 | 0 |
| 194 | 0 | 23 | 7 | 0 | 8 | 0 | 0 | 33 | 0 | 36 | 4 | 0 | 25 | 0 |
| 195 | 0 | 24 | 6 | 0 | 5 | 0 | 0 | 34 | 0 | 37 | 3 | 0 | 24 | 0 |
| 196 | 0 | 25 | 5 | 0 | 7 | 0 | 0 | 35 | 0 | 38 | 2 | 0 | 23 | 0 |
| 197 | 0 | 22 | 8 | 0 | 5 | 0 | 0 | 32 | 0 | 35 | 5 | 0 | 26 | 0 |
| 198 | 0 | 14.5 | 28.9 | 0 | 30.2 | 0 | 0 | 31.5 | 0 | 61.5 | 24 | 0 | 50 | 0 |
| 199 | 0 | 0 | 43.8 | 0 | 21.4 | 0 | 0 | 22.3 | 0 | 54.5 | 0 | 2 | 0 | 0 |
| 200 | 0 | 0 | 43.8 | 0 | 21.4 | 0 | 0 | 22.3 | 0 | 54.5 | 0 | 2 | 0 | 0 |
| 201 | 0 | 0 | 22 | 22 | 21.4 | 0 | 3.5 | 22.3 | 0 | 51.5 | 0 | 1 | 0 | 0 |
| 202 | 0 | 0 | 22 | 22 | 21.4 | 0 | 3.5 | 22.3 | 0 | 51.5 | 20 | 0 | 50 | 0 |
| 203 | 11 | 11 | 21.8 | 0 | 21.4 | 0 | 0 | 22.3 | 0 | 54.5 | 20 | 0 | 45 | 0 |

-continued

| | | | | | | | | | | | | | |
|---|---|---|---|---|---|---|---|---|---|---|---|---|---|
| 204 | 11 | 11 | 21.8 | 0 | 21.4 | 0 | 0 | 22.3 | 0 | 54.5 | 20 | 0 | 44 | 0 |
| 205 | 11 | 11 | 21.8 | 0 | 21.4 | 0 | 0 | 22.3 | 0 | 54.5 | 20 | 0 | 0 | 60 |
| 206 | 11 | 11 | 21.8 | 0 | 21.4 | 0 | 0 | 22.3 | 0 | 54.5 | 20 | 0 | 0 | 65 |

| Batch | Lactic acid (90%) [g] | Ethyl-cellulose | Deuteron XG [g] | Tylose 400 [g] | Di-chloro-acetic acid [g] | H3PO4 (85%) [g] | 1-Methyl-2-pyrrolidone [g] | Citric acid [g] | Ceridust 9202 F [g] | Ethylene glycol [g] | Di-ethylene glycol [g] |
|---|---|---|---|---|---|---|---|---|---|---|---|
| 1 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 |
| 4 | 0 | 0 | 0 | 0 | 0 | 0 | 0 | 0 | 0 | 0 | 0 |
| 5 | 0 | 0 | 0 | 0 | 0 | 0 | 0 | 0 | 0 | 0 | 0 |
| 6 | 0 | 0 | 0 | 0 | 0 | 0 | 0 | 0 | 0 | 0 | 0 |
| 7 | 0 | 0 | 0 | 0 | 0 | 0 | 0 | 0 | 0 | 0 | 0 |
| 8 | 0 | 0 | 0 | 0 | 0 | 0 | 0 | 0 | 0 | 0 | 0 |
| 9 | 0 | 0 | 0 | 0 | 0 | 0 | 0 | 0 | 0 | 0 | 0 |
| 10 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 0 |
| 12 | 0 | 0 | 0 | 0 | 0 | 0 | 0 | 0 | 0 | 0 | 0 |
| 13 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 |
| 16 | 0 | 0 | 0 | 0 | 0 | 0 | 0 | 0 | 0 | 0 | 0 |
| 17 | 0 | 0 | 0 | 0 | 0 | 0 | 0 | 0 | 0 | 0 | 0 |
| 18 | 0 | 0 | 0 | 0 | 0 | 0 | 0 | 0 | 0 | 0 | 0 |
| 19 | 0 | 0 | 0 | 0 | 0 | 0 | 0 | 0 | 0 | 0 | 0 |
| 20 | 0 | 0 | 0 | 0 | 0 | 0 | 0 | 0 | 0 | 0 | 0 |
| 21 | 0 | 0 | 0 | 0 | 0 | 0 | 0 | 0 | 0 | 0 | 0 |
| 22 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 |
| 24 | 0 | 0 | 0 | 0 | 0 | 0 | 0 | 0 | 0 | 0 | 0 |
| 25 | 0 | 0 | 0 | 0 | 0 | 0 | 0 | 0 | 0 | 0 | 0 |
| 26 | 0 | 0 | 0 | 0 | 0 | 0 | 0 | 0 | 0 | 0 | 0 |
| 27 | 0 | 0 | 0 | 0 | 0 | 0 | 0 | 0 | 0 | 0 | 0 |
| 28 | 0 | 0 | 0 | 0 | 0 | 0 | 0 | 0 | 0 | 0 | 0 |
| 29 | 0 | 0 | 0 | 0 | 0 | 0 | 0 | 0 | 0 | 0 | 0 |
| 30 | 0 | 0 | 0 | 0 | 0 | 0 | 0 | 0 | 0 | 0 | 0 |
| 31 | 0 | 0 | 0 | 0 | 0 | 0 | 0 | 0 | 0 | 0 | 0 |
| 32 | 0 | 0 | 0 | 0 | 0 | 0 | 0 | 0 | 0 | 0 | 0 |
| 33 | 0 | 0 | 0 | 0 | 0 | 0 | 0 | 0 | 0 | 0 | 0 |
| 34 | 0 | 0 | 0 | 0 | 0 | 0 | 0 | 0 | 0 | 0 | 0 |
| 35 | 0 | 0 | 0 | 0 | 0 | 0 | 0 | 0 | 0 | 0 | 0 |
| 36 | 0 | 0 | 0 | 0 | 0 | 0 | 0 | 0 | 0 | 0 | 0 |
| 37 | 0 | 0 | 0 | 0 | 0 | 0 | 0 | 0 | 0 | 0 | 0 |
| 38 | 0 | 0 | 0 | 0 | 0 | 0 | 0 | 0 | 0 | 0 | 0 |
| 39 | 0 | 0 | 0 | 0 | 0 | 0 | 0 | 0 | 0 | 0 | 0 |
| 40 | 0 | 0 | 0 | 0 | 0 | 0 | 0 | 0 | 0 | 0 | 0 |
| 41 | 0 | 0 | 0 | 0 | 0 | 0 | 0 | 0 | 0 | 0 | 0 |
| 42 | 0 | 0 | 0 | 0 | 0 | 0 | 0 | 0 | 0 | 0 | 0 |
| 43 | 0 | 0 | 0 | 0 | 0 | 0 | 0 | 0 | 0 | 0 | 0 |
| 44 | 0 | 0 | 0 | 0 | 0 | 0 | 0 | 0 | 0 | 0 | 0 |
| 45 | 0 | 0 | 0 | 0 | 0 | 0 | 0 | 0 | 0 | 0 | 0 |
| 46 | 0 | 0 | 0 | 0 | 0 | 0 | 0 | 0 | 40 | 0 | 0 |
| 47 | 0 | 0 | 0 | 0 | 0 | 0 | 0 | 0 | 40.5 | 0 | 0 |
| 48 | 0 | 0 | 0 | 0 | 0 | 0 | 0 | 0 | 41 | 0 | 0 |
| 49 | 0 | 0 | 0 | 0 | 0 | 0 | 0 | 0 | 41.5 | 0 | 0 |
| 50 | 0 | 0 | 0 | 0 | 0 | 0 | 0 | 0 | 42 | 0 | 0 |
| 51 | 0 | 0 | 0 | 0 | 0 | 0 | 0 | 0 | 42.5 | 0 | 0 |
| 52 | 0 | 0 | 0 | 0 | 0 | 0 | 0 | 0 | 43 | 0 | 0 |
| 53 | 0 | 0 | 0 | 0 | 0 | 0 | 0 | 0 | 43.5 | 0 | 0 |
| 54 | 0 | 0 | 0 | 0 | 0 | 0 | 0 | 0 | 44 | 0 | 0 |
| 55 | 0 | 0 | 0 | 0 | 0 | 0 | 0 | 0 | 44.5 | 0 | 0 |
| 56 | 0 | 0 | 0 | 0 | 0 | 0 | 0 | 0 | 45 | 0 | 0 |
| 57 | 0 | 0 | 0 | 0 | 0 | 0 | 0 | 0 | 45.5 | 0 | 0 |
| 58 | 0 | 0 | 0 | 0 | 0 | 0 | 0 | 0 | 46 | 0 | 0 |
| 59 | 0 | 0 | 0 | 0 | 0 | 0 | 0 | 0 | 46.5 | 0 | 0 |
| 60 | 0 | 0 | 0 | 0 | 0 | 0 | 0 | 0 | 47 | 0 | 0 |
| 61 | 0 | 0 | 0 | 0 | 0 | 0 | 0 | 0 | 47.5 | 0 | 0 |
| 62 | 0 | 0 | 0 | 0 | 0 | 0 | 0 | 0 | 0 | 0 | 0 |
| 63 | 0 | 0 | 0 | 0 | 0 | 0 | 0 | 0 | 0 | 0 | 0 |
| 64 | 0 | 0 | 0 | 0 | 0 | 0 | 0 | 0 | 0 | 0 | 0 |
| 65 | 0 | 0 | 0 | 0 | 0 | 0 | 0 | 0 | 0 | 0 | 0 |
| 66 | 0 | 0 | 0 | 0 | 0 | 0 | 0 | 0 | 0 | 0 | 0 |
| 67 | 0 | 0 | 0 | 0 | 0 | 0 | 0 | 0 | 0 | 0 | 0 |
| 68 | 0 | 0 | 0 | 0 | 0 | 0 | 0 | 0 | 0 | 0 | 0 |
| 69 | 0 | 0 | 0 | 0 | 0 | 0 | 0 | 0 | 0 | 0 | 0 |

-continued

| | | | | | | | | | | | | |
|---|---|---|---|---|---|---|---|---|---|---|---|---|
| 70 | 0 | 0 | 0 | 0 | 0 | 0 | 0 | 0 | 0 | 0 | 0 | 0 |
| 71 | 0 | 0 | 0 | 0 | 0 | 0 | 0 | 0 | 0 | 0 | 0 | 0 |
| 72 | 0 | 0 | 0 | 0 | 0 | 0 | 0 | 0 | 0 | 0 | 0 | 0 |
| 73 | 0 | 0 | 0 | 0 | 0 | 0 | 0 | 0 | 0 | 0 | 0 | 0 |
| 74 | 0 | 0 | 0 | 0 | 0 | 0 | 0 | 0 | 0 | 0 | 0 | 0 |
| 75 | 0 | 0 | 0 | 0 | 0 | 0 | 0 | 0 | 0 | 0 | 0 | 0 |
| 76 | 0 | 0 | 0 | 0 | 0 | 0 | 0 | 0 | 0 | 0 | 0 | 0 |
| 77 | 0 | 0 | 0 | 0 | 0 | 0 | 0 | 0 | 0 | 0 | 0 | 0 |
| 78 | 0 | 0 | 0 | 0 | 0 | 0 | 0 | 0 | 0 | 0 | 0 | 0 |
| 79 | 0 | 0 | 0 | 0 | 0 | 0 | 0 | 0 | 0 | 0 | 0 | 0 |
| 80 | 0 | 0 | 0 | 0 | 0 | 0 | 0 | 0 | 0 | 0 | 0 | 0 |
| 81 | 0 | 0 | 0 | 0 | 0 | 0 | 0 | 0 | 0 | 0 | 0 | 0 |
| 82 | 0 | 0 | 0 | 0 | 0 | 0 | 0 | 0 | 0 | 0 | 0 | 0 |
| 83 | 0 | 0 | 0 | 0 | 0 | 0 | 0 | 0 | 0 | 0 | 0 | 0 |
| 84 | 0 | 0 | 0 | 0 | 0 | 0 | 0 | 0 | 0 | 0 | 0 | 0 |
| 85 | 0 | 0 | 0 | 0 | 0 | 0 | 0 | 0 | 0 | 0 | 0 | 0 |
| 86 | 0 | 0 | 0 | 0 | 0 | 0 | 0 | 0 | 0 | 0 | 0 | 0 |
| 87 | 0 | 0 | 0 | 0 | 0 | 0 | 0 | 0 | 0 | 0 | 0 | 0 |
| 88 | 0 | 0 | 0 | 0 | 0 | 0 | 0 | 0 | 0 | 0 | 0 | 0 |
| 89 | 0 | 0 | 0 | 0 | 0 | 0 | 0 | 0 | 0 | 0 | 0 | 0 |
| 90 | 0 | 0 | 0 | 0 | 0 | 0 | 0 | 0 | 0 | 0 | 0 | 0 |
| 91 | 0 | 0 | 0 | 0 | 0 | 0 | 0 | 0 | 0 | 0 | 0 | 0 |
| 92 | 0 | 0 | 0 | 0 | 0 | 0 | 0 | 0 | 0 | 0 | 0 | 0 |
| 93 | 0 | 0 | 0 | 0 | 0 | 157 | 0 | 42 | 298 | 80 | 78 | |
| 94 | 0 | 0 | 0 | 0 | 0 | 156 | 0 | 43 | 299 | 80 | 78 | |
| 95 | 0 | 0 | 0 | 0 | 0 | 155 | 0 | 44 | 300 | 80 | 78 | |
| 96 | 0 | 0 | 0 | 0 | 0 | 154 | 0 | 45 | 301 | 80 | 78 | |
| 97 | 0 | 0 | 0 | 0 | 0 | 153 | 0 | 46 | 302 | 80 | 78 | |
| 98 | 0 | 0 | 0 | 0 | 0 | 152 | 0 | 47 | 303 | 80 | 78 | |
| 99 | 0 | 0 | 0 | 0 | 0 | 151 | 0 | 48 | 304 | 80 | 78 | |
| 100 | 0 | 0 | 0 | 0 | 0 | 150 | 0 | 49 | 305 | 80 | 78 | |
| 101 | 0 | 0 | 0 | 0 | 0 | 149 | 0 | 50 | 306 | 80 | 78 | |
| 102 | 0 | 0 | 0 | 0 | 0 | 148 | 0 | 51 | 307 | 80 | 78 | |
| 103 | 0 | 0 | 0 | 0 | 0 | 147 | 0 | 52 | 308 | 80 | 78 | |
| 104 | 0 | 0 | 0 | 0 | 0 | 146 | 0 | 53 | 309 | 80 | 78 | |
| 105 | 0 | 0 | 0 | 0 | 0 | 145 | 0 | 54 | 310 | 80 | 78 | |
| 106 | 0 | 0 | 0 | 0 | 0 | 144 | 0 | 55 | 311 | 80 | 78 | |
| 107 | 0 | 0 | 0 | 0 | 0 | 143 | 0 | 56 | 312 | 80 | 78 | |
| 108 | 0 | 0 | 0 | 0 | 0 | 142 | 0 | 57 | 313 | 80 | 78 | |
| 109 | 0 | 0 | 0 | 0 | 0 | 141 | 0 | 58 | 314 | 80 | 78 | |
| 110 | 0 | 0 | 0 | 0 | 0 | 140 | 0 | 59 | 315 | 80 | 78 | |
| 111 | 0 | 0 | 0 | 0 | 0 | 139 | 0 | 60 | 316 | 79 | 79 | |
| 112 | 0 | 0 | 0 | 0 | 0 | 138 | 0 | 61 | 317 | 78 | 80 | |
| 113 | 0 | 0 | 0 | 0 | 0 | 137 | 0 | 62 | 318 | 77 | 81 | |
| 114 | 0 | 0 | 0 | 0 | 0 | 136 | 0 | 63 | 319 | 76 | 82 | |
| 115 | 0 | 0 | 0 | 0 | 0 | 135 | 0 | 64 | 320 | 75 | 83 | |
| 116 | 0 | 0 | 0 | 0 | 0 | 134 | 0 | 65 | 321 | 74 | 84 | |
| 117 | 0 | 0 | 0 | 0 | 0 | 0 | 0 | 0 | 0 | 0 | 0 | |
| 118 | 0 | 0 | 0 | 0 | 0 | 0 | 0 | 0 | 0 | 0 | 0 | |
| 119 | 0 | 0 | 0 | 0 | 0 | 0 | 0 | 0 | 0 | 0 | 0 | |
| 120 | 0 | 0 | 0 | 0 | 0 | 0 | 0 | 0 | 0 | 0 | 0 | |
| 121 | 0 | 0 | 0 | 0 | 0 | 0 | 0 | 0 | 0 | 0 | 0 | |
| 122 | 0 | 0 | 0 | 0 | 0 | 0 | 0 | 0 | 0 | 0 | 0 | |
| 123 | 0 | 0 | 0 | 0 | 0 | 0 | 0 | 0 | 0 | 0 | 0 | |
| 124 | 149 | 3 | 0 | 0 | 0 | 0 | 0 | 0 | 0 | 0 | 0 | |
| 125 | 148 | 4 | 0 | 0 | 0 | 0 | 0 | 0 | 0 | 0 | 0 | |
| 126 | 147 | 10 | 0 | 0 | 0 | 0 | 0 | 0 | 0 | 0 | 0 | |
| 127 | 146 | 6 | 0 | 0 | 0 | 0 | 0 | 0 | 0 | 0 | 0 | |
| 128 | 145 | 7 | 0 | 0 | 0 | 0 | 0 | 0 | 0 | 0 | 0 | |
| 129 | 144 | 8 | 0 | 0 | 0 | 0 | 0 | 0 | 0 | 0 | 0 | |
| 130 | 143 | 9 | 0 | 0 | 0 | 0 | 0 | 0 | 0 | 0 | 0 | |
| 131 | 142 | 10 | 0 | 0 | 0 | 0 | 0 | 0 | 0 | 0 | 0 | |
| 132 | 141 | 11 | 0 | 0 | 0 | 0 | 0 | 0 | 0 | 0 | 0 | |
| 133 | 140 | 12 | 0 | 0 | 0 | 0 | 0 | 0 | 0 | 0 | 0 | |
| 134 | 139 | 13 | 0 | 0 | 0 | 0 | 0 | 0 | 0 | 0 | 0 | |
| 135 | 0 | 0 | 0.8 | 0 | 0 | 0 | 0 | 0 | 0 | 0 | 0 | |
| 136 | 0 | 0 | 0.7 | 0 | 0 | 0 | 0 | 0 | 0 | 0 | 0 | |
| 137 | 0 | 0 | 0.6 | 0 | 0 | 0 | 0 | 0 | 0 | 0 | 0 | |
| 138 | 0 | 0 | 0.5 | 0 | 0 | 0 | 0 | 0 | 0 | 0 | 0 | |
| 139 | 0 | 0 | 0.4 | 0 | 0 | 0 | 0 | 0 | 0 | 0 | 0 | |
| 140 | 0 | 0 | 0.3 | 0 | 0 | 0 | 0 | 0 | 0 | 0 | 0 | |
| 141 | 0 | 0 | 0.2 | 0 | 0 | 0 | 0 | 0 | 0 | 0 | 0 | |
| 142 | 0 | 0 | 0.1 | 0 | 0 | 0 | 0 | 0 | 0 | 0 | 0 | |
| 143 | 0 | 0 | 0 | 3 | 0 | 0 | 0 | 0 | 0 | 0 | 0 | |
| 144 | 0 | 0 | 0 | 2.5 | 0 | 0 | 0 | 0 | 0 | 0 | 0 | |
| 145 | 0 | 0 | 0 | 2 | 0 | 0 | 0 | 0 | 0 | 0 | 0 | |
| 146 | 0 | 0 | 0 | 1.5 | 0 | 0 | 0 | 0 | 0 | 0 | 0 | |
| 147 | 0 | 0 | 0 | 1 | 0 | 0 | 0 | 0 | 0 | 0 | 0 | |
| 148 | 0 | 0 | 0 | 2 | 0 | 0 | 0 | 0 | 0 | 0 | 0 | |

-continued

| Batch | | | | | | | | | | | | |
|---|---|---|---|---|---|---|---|---|---|---|---|---|
| 149 | 0 | 0 | 0 | 2 | 0 | 0 | 0 | 0 | 0 | 0 | 0 | 0 |
| 150 | 0 | 0 | 0 | 0 | 26 | 0 | 0 | 0 | 37 | 0 | 0 | |
| 151 | 0 | 0 | 0 | 0 | 26.5 | 0 | 0 | 0 | 36 | 0 | 0 | |
| 152 | 0 | 0 | 0 | 0 | 27 | 0 | 0 | 0 | 35 | 0 | 0 | |
| 153 | 0 | 0 | 0 | 0 | 27.5 | 0 | 0 | 0 | 34 | 0 | 0 | |
| 154 | 0 | 0 | 0 | 0 | 28 | 0 | 0 | 0 | 33 | 0 | 0 | |
| 155 | 0 | 0 | 0 | 0 | 0 | 224 | 36 | 0 | 300 | 224 | 0 | |
| 156 | 0 | 0 | 0 | 0 | 0 | 223 | 36.5 | 0 | 299 | 223 | 0 | |
| 157 | 0 | 0 | 0 | 0 | 0 | 222 | 37 | 0 | 298 | 222 | 0 | |
| 158 | 0 | 0 | 0 | 0 | 0 | 221 | 37.5 | 0 | 297 | 221 | 0 | |
| 159 | 0 | 0 | 0 | 0 | 0 | 220 | 38 | 0 | 296 | 220 | 0 | |
| 160 | 0 | 0 | 0 | 0 | 0 | 219 | 38.5 | 0 | 295 | 219 | 0 | |
| 161 | 0 | 0 | 0 | 0 | 0 | 218 | 39 | 0 | 294 | 218 | 0 | |
| 162 | 0 | 0 | 0 | 0 | 0 | 217 | 39.5 | 0 | 293 | 217 | 0 | |
| 163 | 0 | 0 | 0 | 0 | 0 | 216 | 40 | 0 | 292 | 216 | 0 | |
| 164 | 0 | 0 | 0 | 0 | 0 | 215 | 40.5 | 0 | 291 | 215 | 0 | |
| 165 | 0 | 0 | 0 | 0 | 0 | 214 | 41 | 0 | 290 | 214 | 0 | |
| 166 | 0 | 0 | 0 | 0 | 0 | 213 | 41.5 | 0 | 289 | 213 | 0 | |
| 167 | 0 | 0 | 0 | 0 | 0 | 212 | 42 | 0 | 288 | 212 | 0 | |
| 168 | 0 | 0 | 0 | 0 | 0 | 211 | 42.5 | 0 | 287 | 211 | 0 | |
| 169 | 0 | 0 | 0 | 0 | 0 | 0 | 0 | 0 | 293 | 0 | 0 | |
| 170 | 0 | 0 | 0 | 0 | 0 | 0 | 0 | 0 | 292 | 0 | 0 | |
| 171 | 0 | 0 | 0 | 0 | 0 | 0 | 0 | 0 | 291 | 0 | 0 | |
| 172 | 0 | 0 | 0 | 0 | 0 | 0 | 0 | 0 | 290 | 0 | 0 | |
| 173 | 0 | 0 | 0 | 0 | 0 | 0 | 0 | 0 | 289 | 0 | 0 | |
| 174 | 0 | 0 | 0 | 0 | 0 | 0 | 0 | 0 | 288 | 0 | 0 | |
| 175 | 0 | 0 | 0 | 0 | 0 | 0 | 0 | 0 | 287 | 0 | 0 | |
| 176 | 0 | 0 | 0 | 0 | 0 | 0 | 0 | 0 | 286 | 0 | 0 | |
| 177 | 0 | 0 | 0 | 0 | 0 | 0 | 0 | 0 | 285 | 0 | 0 | |
| 178 | 0 | 0 | 0 | 0 | 0 | 0 | 0 | 0 | 284 | 0 | 0 | |
| 179 | 0 | 0 | 0 | 0 | 0 | 0 | 0 | 0 | 283 | 0 | 0 | |
| 180 | 0 | 0 | 0 | 0 | 0 | 0 | 0 | 0 | 282 | 0 | 0 | |
| 181 | 0 | 0 | 0 | 0 | 0 | 0 | 0 | 0 | 281 | 0 | 0 | |
| 182 | 0 | 0 | 0 | 0 | 0 | 0 | 0 | 0 | 280 | 0 | 0 | |
| 183 | 0 | 0 | 0 | 0 | 0 | 0 | 0 | 0 | 279 | 0 | 0 | |
| 184 | 0 | 0 | 0 | 0 | 0 | 0 | 0 | 0 | 278 | 0 | 0 | |
| 185 | 0 | 0 | 0 | 0 | 0 | 0 | 0 | 0 | 277 | 0 | 0 | |
| 186 | 0 | 0 | 0 | 0 | 0 | 0 | 0 | 0 | 276 | 0 | 0 | |
| 187 | 0 | 0 | 0 | 0 | 0 | 0 | 0 | 0 | 275 | 0 | 0 | |
| 188 | 0 | 0 | 0 | 0 | 0 | 0 | 0 | 0 | 274 | 0 | 0 | |
| 189 | 0 | 0 | 0 | 0 | 0 | 0 | 0 | 0 | 273 | 0 | 0 | |
| 190 | 0 | 0 | 0 | 0 | 28.5 | 0 | 0 | 0 | 32 | 0 | 0 | |
| 191 | 0 | 0 | 0 | 0 | 27 | 0 | 0 | 0 | 32 | 0 | 0 | |
| 192 | 0 | 0 | 0 | 0 | 26.75 | 0 | 0 | 0 | 31 | 0 | 0 | |
| 193 | 0 | 0 | 0 | 0 | 26.5 | 0 | 0 | 0 | 31 | 0 | 0 | |
| 194 | 0 | 0 | 0 | 0 | 0 | 0 | 0 | 0 | 0 | 0 | 0 | |
| 195 | 0 | 0 | 0 | 0 | 0 | 0 | 0 | 0 | 0 | 0 | 0 | |
| 196 | 0 | 0 | 0 | 0 | 0 | 0 | 0 | 0 | 0 | 0 | 0 | |
| 197 | 0 | 0 | 0 | 0 | 0 | 0 | 0 | 0 | 0 | 0 | 0 | |
| 198 | 0 | 0 | 0 | 0 | 0 | 0 | 0 | 0 | 0 | 0 | 0 | |
| 199 | 0 | 0 | 0 | 0 | 0 | 0 | 0 | 0 | 48 | 0 | 0 | |
| 200 | 0 | 0 | 0 | 0 | 0 | 0 | 0 | 0 | 48.5 | 0 | 0 | |
| 201 | 0 | 0 | 0 | 0 | 0 | 0 | 0 | 0 | 49 | 0 | 0 | |
| 202 | 0 | 0 | 0 | 0 | 0 | 0 | 0 | 0 | 0 | 0 | 0 | |
| 203 | 0 | 0 | 0 | 0 | 0 | 0 | 0 | 0 | 0 | 0 | 0 | |
| 204 | 0 | 0 | 0 | 0 | 0 | 0 | 0 | 0 | 0 | 0 | 0 | |
| 205 | 0 | 0 | 0 | 0 | 0 | 0 | 0 | 0 | 0 | 0 | 0 | |
| 206 | 0 | 0 | 0 | 0 | 0 | 0 | 0 | 0 | 0 | 0 | 0 | |

Further examples of compositions according to the invention having advantageous properties for the etching of SiNx are given in the following tables.

| Batch | Tri-ethylene glycol mono-methyl ether [g] | H2O [g] | Stabileze QM [g] | Poly-ethylene glycol [g] | PVP K90 [g] | Natrosol GR250 [g] | Vestosint PA 2070 [g] | Lactic acid (90%) [g] | H3PO4 (85%) [g] | 1-Methyl-2-pyrrolidone [g] | Ceridust 9202 F [g] | Ethylene glycol [g] | Aerosil 200 [g] | PVP K30 [g] |
|---|---|---|---|---|---|---|---|---|---|---|---|---|---|---|
| 1 | 0 | 0 | 0 | 0 | 0 | 0 | 13 | 0 | 100 | 0 | 0 | 0 | 2 | 0 |
| 2 | 0 | 0 | 0 | 0 | 0 | 0 | 12 | 0 | 100 | 0 | 0 | 0 | 2.5 | 0 |

-continued

| Batch | Tri-ethylene glycol mono-methyl ether [g] | H2O [g] | Stabileze QM [g] | Poly-ethylene glycol [g] | PVP K90 [g] | Natrosol GR250 [g] | Vestosint PA 2070 [g] | Lactic acid (90%) [g] | H3PO4 (85%) [g] | 1-Methyl-2-pyrrolidone [g] | Ceridust 9202 F [g] | Ethylene glycol [g] | Aerosil 200 [g] | PVP K30 [g] |
|---|---|---|---|---|---|---|---|---|---|---|---|---|---|---|
| 3 | 0 | 0 | 0 | 0 | 0 | 0 | 11 | 0 | 100 | 0 | 0 | 0 | 3 | 0 |
| 4 | 0 | 0 | 0 | 0 | 0 | 0 | 10 | 0 | 100 | 0 | 0 | 0 | 3.5 | 0 |
| 5 | 0 | 0 | 0 | 0 | 0 | 0 | 9 | 0 | 100 | 0 | 0 | 0 | 4 | 0 |
| 6 | 0 | 0 | 0 | 0 | 0 | 0 | 8 | 0 | 100 | 0 | 0 | 0 | 4.5 | 0 |
| 7 | 0 | 0 | 0 | 0 | 0 | 0 | 7 | 0 | 100 | 0 | 0 | 0 | 5 | 0 |
| 8 | 0 | 0 | 0 | 0 | 0 | 0 | 6 | 0 | 100 | 0 | 0 | 0 | 5.5 | 0 |
| 9 | 0 | 0 | 0 | 0 | 0 | 0 | 5 | 0 | 100 | 0 | 0 | 0 | 6 | 0 |
| 10 | 0 | 0 | 0 | 0 | 0 | 3 | 24 | 0 | 48.5 | 48.5 | 0 | 0 | 0 | 0 |
| 11 | 0 | 0 | 0 | 0 | 0 | 2.8 | 24.5 | 0 | 48.5 | 48.5 | 0 | 0 | 0 | 0 |
| 12 | 0 | 0 | 0 | 0 | 0 | 2.6 | 25 | 0 | 48.5 | 48.5 | 0 | 0 | 0 | 0 |
| 13 | 0 | 0 | 0 | 0 | 0 | 2.4 | 25.5 | 0 | 48.5 | 48.5 | 0 | 0 | 0 | 0 |
| 14 | 0 | 0 | 0 | 0 | 0 | 2.2 | 26 | 0 | 48.5 | 48.5 | 0 | 0 | 0 | 0 |
| 15 | 0 | 0 | 0 | 0 | 0 | 2 | 26.5 | 0 | 48.5 | 48.5 | 0 | 0 | 0 | 0 |
| 16 | 0 | 0 | 0 | 0 | 0 | 1.8 | 27 | 0 | 48.5 | 48.5 | 0 | 0 | 0 | 0 |
| 17 | 0 | 0 | 0 | 0 | 0 | 1.6 | 27.5 | 0 | 48.5 | 48.5 | 0 | 0 | 0 | 0 |
| 18 | 0 | 181 | 0 | 0 | 0 | 19 | 0 | 0 | 460 | 102 | 263 | 185 | 0 | 0 |
| 19 | 0 | 181 | 0 | 0 | 0 | 18.5 | 0 | 0 | 460 | 101 | 263 | 184 | 0 | 0 |
| 20 | 0 | 181 | 0 | 0 | 0 | 18 | 0 | 0 | 460 | 100 | 263 | 183 | 0 | 0 |
| 21 | 0 | 181 | 0 | 0 | 0 | 17.5 | 0 | 0 | 460 | 99 | 263 | 182 | 0 | 0 |
| 22 | 0 | 181 | 0 | 0 | 0 | 17 | 0 | 0 | 460 | 98 | 263 | 181 | 0 | 0 |
| 23 | 0 | 181 | 0 | 0 | 0 | 16.5 | 0 | 0 | 460 | 97 | 263 | 180 | 0 | 0 |
| 24 | 0 | 181 | 0 | 0 | 0 | 16 | 0 | 0 | 460 | 96 | 263 | 179 | 0 | 0 |
| 25 | 0 | 181 | 0 | 0 | 0 | 15.5 | 0 | 0 | 460 | 95 | 263 | 178 | 0 | 0 |
| 26 | 0 | 180 | 0 | 0 | 0 | 15.8 | 0 | 0 | 446 | 271 | 285 | 0 | 0 | 0 |
| 27 | 0 | 179 | 0 | 0 | 0 | 15.6 | 0 | 0 | 446 | 271 | 287 | 0 | 0 | 0 |
| 28 | 0 | 178 | 0 | 0 | 0 | 15.4 | 0 | 0 | 446 | 271 | 289 | 0 | 0 | 0 |
| 29 | 0 | 177 | 0 | 0 | 0 | 15.2 | 0 | 0 | 446 | 271 | 291 | 0 | 0 | 0 |
| 30 | 0 | 176 | 0 | 0 | 0 | 15 | 0 | 0 | 446 | 271 | 293 | 0 | 0 | 0 |
| 31 | 0 | 0 | 0 | 0 | 0 | 0 | 0 | 0 | 464 | 455 | 229 | 0 | 0 | 59.5 |
| 32 | 0 | 0 | 0 | 0 | 0 | 0 | 0 | 0 | 462 | 456 | 228 | 0 | 0 | 59 |
| 33 | 0 | 0 | 0 | 0 | 0 | 0 | 0 | 0 | 460 | 457 | 227 | 0 | 0 | 58.5 |
| 34 | 0 | 0 | 0 | 0 | 0 | 0 | 0 | 0 | 458 | 458 | 226 | 0 | 0 | 58 |
| 35 | 0 | 0 | 0 | 0 | 0 | 0 | 0 | 0 | 456 | 459 | 225 | 0 | 0 | 57.5 |
| 36 | 0 | 0 | 0 | 0 | 0 | 0 | 0 | 0 | 454 | 460 | 224 | 0 | 0 | 57 |
| 37 | 0 | 0 | 0 | 0 | 0 | 0 | 0 | 0 | 452 | 461 | 223 | 0 | 0 | 56.5 |
| 38 | 0 | 0 | 0 | 0 | 0 | 0 | 0 | 0 | 450 | 462 | 222 | 0 | 0 | 56 |
| 39 | 20 | 0 | 0 | 0 | 0 | 0 | 0 | 0 | 448 | 463 | 221 | 0 | 0 | 55.5 |
| 40 | 30 | 0 | 0 | 0 | 0 | 0 | 0 | 0 | 446 | 464 | 220 | 0 | 0 | 55 |
| 41 | 40 | 0 | 0 | 0 | 0 | 0 | 0 | 0 | 444 | 465 | 219 | 0 | 0 | 54.5 |
| 42 | 0 | 0 | 0 | 229 | 0 | 0 | 0 | 0 | 478 | 241 | 228 | 0 | 0 | 0 |
| 43 | 0 | 0 | 0 | 232 | 0 | 0 | 0 | 0 | 479 | 241 | 230 | 0 | 0 | 0 |
| 44 | 0 | 0 | 0 | 235 | 0 | 0 | 0 | 0 | 480 | 241 | 232 | 0 | 0 | 0 |
| 45 | 0 | 0 | 0 | 238 | 0 | 0 | 0 | 0 | 481 | 241 | 234 | 0 | 0 | 0 |
| 46 | 0 | 0 | 0 | 241 | 0 | 0 | 0 | 0 | 482 | 241 | 236 | 0 | 0 | 0 |
| 47 | 0 | 0 | 0 | 244 | 0 | 0 | 0 | 0 | 483 | 241 | 238 | 0 | 0 | 0 |
| 48 | 0 | 0 | 0 | 247 | 0 | 0 | 0 | 0 | 484 | 241 | 240 | 0 | 0 | 0 |
| 49 | 0 | 0 | 0 | 250 | 0 | 0 | 0 | 0 | 485 | 241 | 242 | 0 | 0 | 0 |
| 50 | 0 | 240 | 25 | 0 | 0 | 11 | 0 | 0 | 484 | 230 | 238 | 0 | 0 | 0 |
| 51 | 0 | 238 | 25 | 0 | 0 | 11 | 0 | 0 | 484 | 230 | 235 | 0 | 0 | 0 |
| 52 | 0 | 236 | 25 | 0 | 0 | 11 | 0 | 0 | 484 | 230 | 232 | 0 | 0 | 0 |
| 53 | 0 | 234 | 25 | 0 | 0 | 11 | 0 | 0 | 484 | 230 | 229 | 0 | 0 | 0 |
| 54 | 0 | 232 | 25 | 0 | 0 | 11 | 0 | 0 | 484 | 230 | 226 | 0 | 0 | 0 |
| 55 | 0 | 230 | 25 | 0 | 0 | 11 | 0 | 0 | 484 | 230 | 223 | 0 | 0 | 0 |
| 56 | 0 | 228 | 25 | 0 | 0 | 11 | 0 | 0 | 484 | 230 | 220 | 0 | 0 | 0 |
| 57 | 0 | 226 | 25 | 0 | 0 | 11 | 0 | 0 | 484 | 230 | 217 | 0 | 0 | 0 |
| 58 | 2 | 224 | 25 | 0 | 0 | 11 | 0 | 0 | 484 | 230 | 214 | 0 | 0 | 0 |
| 59 | 4 | 222 | 25 | 0 | 0 | 11 | 0 | 0 | 484 | 230 | 211 | 0 | 0 | 0 |
| 60 | 6 | 220 | 25 | 0 | 0 | 11 | 0 | 0 | 484 | 230 | 208 | 0 | 0 | 0 |
| 61 | 8 | 218 | 25 | 0 | 0 | 11 | 0 | 0 | 484 | 230 | 205 | 0 | 0 | 0 |
| 62 | 0 | 218 | 8 | 0 | 0 | 8 | 0 | 0 | 465 | 223 | 275 | 0 | 0 | 0 |
| 63 | 0 | 219 | 7.7 | 0 | 0 | 8.5 | 0 | 0 | 463 | 223 | 276 | 0 | 0 | 0 |
| 64 | 0 | 220 | 7.4 | 0 | 0 | 9 | 0 | 0 | 461 | 223 | 277 | 0 | 0 | 0 |
| 65 | 0 | 221 | 7.1 | 0 | 0 | 9.5 | 0 | 0 | 459 | 223 | 278 | 0 | 0 | 0 |
| 66 | 0 | 222 | 6.8 | 0 | 0 | 10 | 0 | 0 | 457 | 223 | 279 | 0 | 0 | 0 |
| 67 | 0 | 223 | 6.5 | 0 | 0 | 10.5 | 0 | 0 | 455 | 223 | 280 | 0 | 0 | 0 |
| 68 | 0 | 224 | 6.2 | 0 | 0 | 11 | 0 | 0 | 453 | 223 | 281 | 0 | 0 | 0 |
| 69 | 0 | 225 | 5.9 | 0 | 0 | 11.5 | 0 | 0 | 451 | 223 | 282 | 0 | 0 | 0 |
| 70 | 0 | 226 | 5.6 | 0 | 0 | 12 | 0 | 0 | 449 | 223 | 283 | 0 | 0 | 0 |
| 71 | 0 | 227 | 5.3 | 0 | 0 | 12.5 | 0 | 0 | 447 | 223 | 284 | 0 | 0 | 0 |
| 72 | 0 | 228 | 5 | 0 | 0 | 13 | 0 | 0 | 445 | 223 | 285 | 0 | 0 | 0 |
| 73 | 0 | 229 | 4.7 | 0 | 0 | 13.5 | 0 | 0 | 443 | 223 | 286 | 0 | 0 | 0 |

-continued

| Batch | Tri-ethylene glycol mono-methyl ether [g] | H2O [g] | Stabileze QM [g] | Poly-ethylene glycol [g] | PVP K90 [g] | Natrosol GR250 [g] | Vestosint PA 2070 [g] | Lactic acid (90%) [g] | H3PO4 (85%) [g] | 1-Methyl-2-pyrrolidone [g] | Ceridust 9202 F [g] | Ethylene glycol [g] | Aerosil 200 [g] | PVP K30 [g] |
|---|---|---|---|---|---|---|---|---|---|---|---|---|---|---|
| 74 | 0 | 0 | 0 | 0 | 0 | 0 | 0 | 0 | 450 | 466 | 284 | 0 | 0 | 60 |
| 75 | 0 | 0 | 0 | 0 | 0 | 0 | 0 | 0 | 452 | 464 | 283 | 0 | 0 | 59.5 |
| 76 | 0 | 0 | 0 | 0 | 0 | 0 | 0 | 0 | 454 | 462 | 282 | 0 | 0 | 59 |
| 77 | 0 | 0 | 0 | 0 | 0 | 0 | 0 | 0 | 456 | 460 | 281 | 0 | 0 | 58.5 |
| 78 | 0 | 0 | 0 | 0 | 0 | 0 | 0 | 0 | 458 | 458 | 280 | 0 | 0 | 58 |
| 79 | 0 | 0 | 0 | 0 | 0 | 0 | 0 | 0 | 460 | 456 | 279 | 0 | 0 | 57.5 |
| 80 | 0 | 0 | 0 | 0 | 0 | 0 | 0 | 0 | 462 | 454 | 278 | 0 | 0 | 57 |
| 81 | 0 | 0 | 0 | 0 | 0 | 0 | 0 | 0 | 464 | 452 | 277 | 0 | 0 | 56.5 |
| 82 | 0 | 0 | 0 | 0 | 0 | 0 | 0 | 0 | 450 | 466 | 267 | 0 | 0 | 60 |
| 83 | 0 | 0 | 0 | 0 | 0 | 0 | 0 | 0 | 452 | 464 | 264 | 0 | 0 | 59.5 |
| 84 | 0 | 0 | 0 | 0 | 0 | 0 | 0 | 0 | 454 | 462 | 261 | 0 | 0 | 59 |
| 85 | 0 | 0 | 0 | 0 | 0 | 0 | 0 | 0 | 456 | 460 | 258 | 0 | 0 | 58.5 |
| 86 | 0 | 0 | 0 | 0 | 0 | 0 | 0 | 0 | 458 | 458 | 255 | 0 | 0 | 58 |
| 87 | 0 | 0 | 0 | 0 | 0 | 0 | 0 | 0 | 460 | 456 | 252 | 0 | 0 | 57.5 |
| 88 | 0 | 0 | 0 | 0 | 0 | 0 | 0 | 0 | 462 | 454 | 249 | 0 | 0 | 57 |
| 89 | 0 | 0 | 0 | 0 | 0 | 0 | 0 | 0 | 464 | 452 | 246 | 0 | 0 | 56.5 |
| 90 | 0 | 0 | 0 | 0 | 0 | 0 | 0 | 0 | 466 | 450 | 243 | 0 | 0 | 56 |
| 91 | 0 | 0 | 0 | 0 | 0 | 0 | 0 | 0 | 468 | 448 | 240 | 0 | 0 | 55.5 |
| 92 | 0 | 0 | 0 | 0 | 0 | 0 | 0 | 0 | 470 | 446 | 237 | 0 | 0 | 55 |
| 93 | 0 | 223 | 6.9 | 0 | 0 | 14 | 0 | 0 | 453 | 223 | 279 | 0 | 0 | 0 |
| 94 | 0 | 223 | 6.8 | 0 | 0 | 14 | 0 | 0 | 453 | 223 | 279 | 0 | 0 | 0 |
| 95 | 0 | 223 | 6.7 | 0 | 0 | 14 | 0 | 0 | 453 | 223 | 279 | 0 | 0 | 0 |
| 96 | 0 | 223 | 6.6 | 0 | 0 | 14 | 0 | 0 | 453 | 223 | 279 | 0 | 0 | 0 |
| 97 | 0 | 223 | 6.5 | 0 | 0 | 14 | 0 | 0 | 453 | 223 | 279 | 0 | 0 | 0 |
| 98 | 0 | 223 | 6.4 | 0 | 0 | 14 | 0 | 0 | 453 | 223 | 279 | 0 | 0 | 0 |
| 99 | 0 | 223 | 6.3 | 0 | 0 | 14 | 0 | 0 | 453 | 223 | 279 | 0 | 0 | 0 |
| 100 | 0 | 223 | 6.3 | 0 | 0 | 14.5 | 0 | 0 | 453 | 223 | 279 | 0 | 0 | 0 |
| 101 | 0 | 223 | 6.3 | 0 | 0 | 15 | 0 | 0 | 453 | 223 | 279 | 0 | 0 | 0 |
| 102 | 0 | 223 | 6.3 | 0 | 0 | 15.5 | 0 | 0 | 453 | 223 | 279 | 0 | 0 | 0 |
| 103 | 0 | 223 | 6.3 | 0 | 0 | 16 | 0 | 0 | 453 | 223 | 279 | 0 | 0 | 0 |
| 104 | 0 | 223 | 6.3 | 0 | 0 | 16.5 | 0 | 0 | 453 | 223 | 279 | 0 | 0 | 0 |
| 105 | 0 | 223 | 6.3 | 0 | 0 | 17 | 0 | 0 | 453 | 223 | 279 | 0 | 0 | 0 |
| 106 | 0 | 223 | 6.3 | 0 | 0 | 17 | 0 | 0 | 453 | 223 | 276 | 0 | 0 | 0 |
| 107 | 0 | 223 | 6.3 | 0 | 0 | 17 | 0 | 0 | 453 | 223 | 273 | 0 | 0 | 0 |
| 108 | 0 | 223 | 6.3 | 0 | 0 | 17 | 0 | 0 | 453 | 223 | 270 | 0 | 0 | 0 |
| 109 | 0 | 223 | 6.3 | 0 | 0 | 17 | 0 | 0 | 453 | 223 | 267 | 0 | 0 | 0 |
| 110 | 11 | 223 | 6.3 | 0 | 0 | 17 | 0 | 2 | 453 | 223 | 264 | 0 | 0 | 0 |
| 111 | 13 | 223 | 6.3 | 0 | 0 | 17 | 0 | 4 | 453 | 223 | 264 | 0 | 0 | 0 |
| 112 | 15 | 223 | 6.3 | 0 | 0 | 17 | 0 | 6 | 453 | 223 | 264 | 0 | 0 | 0 |
| 113 | 17 | 223 | 6.3 | 0 | 0 | 17 | 0 | 8 | 453 | 223 | 264 | 0 | 0 | 0 |
| 114 | 19 | 223 | 6.3 | 0 | 0 | 17 | 0 | 10 | 453 | 223 | 264 | 0 | 0 | 0 |

Comparative Example

Etching Paste without Particulate Additives

For a comparative test, the following pressure and etching parameters were used:

| | |
|---|---|
| Screen: | steel screen having a mesh count of 280 mesh/inch and a filament diameter of 25 μm and an emulsion thickness of 15 μm. |
| Layout: | 100 μm lines |
| Screen printing machine: | EKRA E1 |
| Wafers: | single-crystal silicon wafers, with 100 nm thermal SiO$_2$ |
| Etching: | heated at 50° C. for 30 s |
| Result: | Line width after etching and rinsing: about 180 μm on average |

Comparative Example

Etching Paste with Particulate Additives

For a comparative test, the following pressure and etching parameters were used:

| | |
|---|---|
| Screen: | steel screen having a mesh count of 280 mesh/inch and a filament diameter of 25 μm and an emulsion thickness of 15 μm. |
| Layout: | 100 μm lines |
| Screen printing machine: | EKRA E1 |
| Wafers: | single-crystal silicon wafers, with 100 nm thermal SiO$_2$ |
| Etching: | heated at 50° C. for 30 s |
| Result: | The etched line had a width of 105 μm on average. |

The invention claimed is:

1. A printable etching medium in the form of a paste for etching and optionally doping inorganic glass-like or crystalline layers selected from the group of glasses based on silicon dioxide and the glasses based on silicon nitride, which are located on crystalline or amorphous silicon surfaces, comprising
- a) an etching component
- b) solvent
- c) polymer particles having a relative particle diameter in the range from 10 nm to 50 µm,
- d) optionally a homogeneously dissolved organic thickener
- e) optionally at least one inorganic and/or organic acid,
- f) optionally an additive
and
- g) optionally inorganic particles, said medium having a viscosity at 20° C. in the range from 6 to 35 Pa*s at a shear rate of 25 s$^{-1}$.

2. A printable etching medium according to claim 1, wherein the polymer particles have a relative particle diameter in the range from 100 nm to 30 µm.

3. A printable etching medium according to claim 1, comprising polymer particles in an amount of 1 to 80% by weight, based on the total amount of medium.

4. A printable etching medium according to claim 1, comprising polymer particles in an amount of 10 to 50% by weight based on the total amount of medium.

5. A printable etching medium according to claim 1, wherein the etching component is present in an amount of 12 to 30% by weight based on the total amount of medium.

6. A printable etching medium according to claim 1, characterised in that the thickener is present in an amount of 3 to 20% by weight, based on the total amount of medium.

7. A printable etching medium according to claim 1, comprising one or different forms of phosphoric acid, phosphoric acid salts or compounds which are decomposed to the corresponding phosphoric acid on heating and act as etching and as doping components.

8. A printable etching medium according to claim 1 for surfaces of glasses which comprise elements selected from the group of calcium, sodium, aluminium, lead, lithium, magnesium, barium, potassium, boron, beryllium, phosphorus, gallium, arsenic, antimony, lanthanum, scandium, zinc, thorium, copper, chromium, manganese, iron, cobalt, nickel, molybdenum, vanadium, titanium, gold, platinum, palladium, silver, cerium, caesium, niobium, tantalum, zirconium, yttrium, neodymium and praseodymium.

9. A printable etching medium according to claim 1, comprising as etching component,
at least one fluorine compound selected from the group of ammonium, alkali metal and antimony fluorides, ammonium, alkali metal and calcium bifluorides, alkylated ammonium and potassium tetrafluoroborates
and/or
optionally at least one inorganic mineral acid selected from the group of hydrochloric acid, phosphoric acid, sulfuric acid and nitric acid
and/or optionally
at least one organic acid, which may contain a straight-chain or branched alkyl radical having 1-10 C atoms, selected from the group of the alkylcarboxylic acids, the hydroxycarboxylic acids and the dicarboxylic acids.

10. A printable etching medium according to claim 9, comprising an organic acid selected from the group of formic acid, acetic acid, lactic acid and oxalic acid.

11. A printable etching medium according to claim 1, wherein the proportion of the organic and/or inorganic acids is in a concentration range from 0 to 80% by weight, based on the total amount of the medium, where the added acids each have a pK$_a$ value between 0 and 5.

12. A printable etching medium according to claim 1, comprising a solvent that is: water, a mono- or polyhydric alcohols alcohol, such as glycerol, 1,2-propanediol, 1,4-butanediol, 1,3-butanediol, 1,5-pentanediol, 2-ethyl-1-hexenol, ethylene glycol, diethylene glycol, dipropylene glycol, or an ester thereof, ethylene glycol monobutyl ether, triethylene glycol monomethyl ether, diethylene glycol monobutyl ether, dipropylene glycol monomethyl ether, [2,2-butoxy(ethoxy)] ethyl acetate, an ester of carbonic acid, propylene carbonate, a ketone acetophenone, methyl-2-hexanone, 2-octanone, 4-hydroxy-4-methyl-2-pentanone, 1-methyl-2-pyrrolidone, or a mixture thereof, in an amount of 10 to 90% by weight based on the total amount of the medium.

13. A printable etching medium according to claim 1, comprising a polymer particle that is a
polystyrene, polyacrylic, polyamide, polyimide, polymethacrylate, melamine, urethane, benzoguanine or a phenolic resin, a silicone resin, a micronised cellulose, a fluorinated polymer (PTFE, PVDF) or a micronised wax.

14. A printable etching medium according to claim 1, wherein said inorganic particle is an aluminium oxide, a calcium fluoride, a boron oxide or a sodium chloride.

15. A printable etching medium according to claim 1, comprising one or more homogeneously dissolved
thickener that is a cellulose, a cellulose derivative, a starch, a starch derivative, xanthan or a polyvinylpyrrolidone polymer based on an acrylate of functionalised vinyl units.

16. A printable etching medium according to claim 1, comprising a homogeneously distributed thickener that is:
- a) a cellulose/cellulose derivative and/or
- b) starch/starch derivative and/or
- c) xanthan and/or
- d) a polyvinylpyrrolidone polymer based on an acrylate of functionalised vinyl units in an amount of 0.5 to 25% by weight, based on the total amount of the etching medium.

17. A printable etching medium according to claim 1, comprising 0 to 5% by weight, based on the total amount, of additives selected from the group of antifoams, thixotropic agents, flow-control agents, deaerators and adhesion promoters.

18. The etching medium according to claim 1, comprising a viscosity at 20° C. in the range from 10 to 25 Pa*s at a shear rate of 25 s$^{-1}$.

19. The medium according to claim 1, wherein said optional additive is an antifoam agent, a thixotropic agent, a flow-control agent, a deaerator or an adhesion promoter.

20. The etching medium according to claim 1, comprising
- a) an etching component
- b) 2 to 20% by weight, based on the total amount of a solvent
- c) 20 to 40% by weight, based on the total amount of polymer particles having a relative particle diameter in the range from 1 µm to 10 µm, said medium having a viscosity at 20° C. in the range 10 to 25 Pa*s at a shear rate of 25 s$^{-1}$.

21. The etching medium according to claim 1, having a viscosity at 20° C. in the range from 15 to 20 Pa*s at a shear rate of 25 s$^{-1}$.

22. A method of etching comprising applying to a surface an etching medium of claim 1 and removing it after a reaction time of 10 s-15 min.

23. An etching process comprising applying a printable etching medium according to claim 1 to the surface to be etched and removing said printable etching medium after a reaction time of 10 s-15 min.

24. A process according to claim 23, wherein said surface to be etched is a photovoltaic surface, a semiconductor surface, a high-performance electronic surface, a photodiode, a viewing window for a valve or a measuring instrument, a glass support for an outdoor application, a medical glass surface, a decorative glass, a sanitary glass, a cosmetic article, a food or beverage container surface, a flat glass or a flat-panel screen.

25. A process according to claim 23, wherein said medium is applied by an off-contact and on-contact screen, pad, stamp, ink-jet or manual printing process.

26. A process according to claim 23, wherein said surface to be etched is a support for a solar cell or a thermal collector.

27. A process according to claim 23, for the etching of $SiO_2$— or silicon nitride-containing glasses as uniform single-material non-porous and porous solids or of corresponding non-porous or porous glass layers of variable thickness which have been produced on other substrates.

28. A process according to claim 23, for the etching of uniform, single-material, non-porous or porous glasses based on silicon dioxide or nitride systems and of layers of variable thickness of such systems.

29. A process according to claim 23, for removing silicon oxide/doped silicon oxide and silicon nitride layers, for the selective opening of passivation layers comprising silicon oxide and silicon nitride for the production of dual-stage selective emitters and/or local $p^+$ back-surface fields.

30. A process according to claim 23, for the opening of passivation layers comprising silicon oxide and silicon nitride in the process for the production of semiconductor components and their circuits.

31. A process according to claim 23, for the opening of passivation layers comprising silicon oxide and silicon nitride in the process for the production of components for high-performance electronics.

32. A process according to claim 23, for mineralogical, geological and microstructural investigations.

33. An etching process according to claim 23, wherein said etching is carried out at elevated temperatures in the range from 40 to 200° C. and further comprising removing said printable etching medium after a reaction time of 30 s to 2 min.

34. A process for the etching of inorganic, glass-like, crystalline surfaces, comprising applying an etching medium according to claim 1 over the entire surface or specifically, in accordance with the etching structure pattern, only at the points where etching is desired, and, after etching is complete, is rinsed off using a solvent or solvent mixture or burned off by heating.

35. A process according to claim 34, wherein said doping is carried out by heating.

36. A process according to claim 34, wherein said etching medium is rinsed off with water after etching is complete.

37. An etching process according to claim 34, wherein said etching is carried out at elevated temperatures in the range from 30 to 330° C.

38. An etching process according to claim 34, wherein said etching of $SiO_2$ or $SiN_x$ layers is carried out at elevated temperatures in the range from 50 to 100° C. at etching rates of 0.5 to 8 nm/s.

* * * * *

UNITED STATES PATENT AND TRADEMARK OFFICE
CERTIFICATE OF CORRECTION

PATENT NO. : 7,837,890 B2
APPLICATION NO. : 11/813632
DATED : November 23, 2010
INVENTOR(S) : Stockum et al.

It is certified that error appears in the above-identified patent and that said Letters Patent is hereby corrected as shown below:

Column 28, line 2 reads "prising a solvent that is: water, a mono- or polyhydric alco-"
should read -- prising a solvent that is: water, a mono- or polyhydric --

Column 28, line 3 reads "hols alcohol, such as glycerol, 1,2-propanediol, 1,4-butane-"
should read -- alcohol, glycerol, 1,2-propanediol, 1,4-butane- --

Signed and Sealed this
Sixteenth Day of August, 2011

David J. Kappos
*Director of the United States Patent and Trademark Office*